United States Patent [19]
Nishino et al.

[11] Patent Number: 6,052,329
[45] Date of Patent: Apr. 18, 2000

[54] OUTPUT CIRCUIT AND SYNCHRONOUS SEMICONDUCTOR MEMORY DEVICE HAVING A FUNCTION OF PREVENTING OUTPUT OF INVALID DATA

[75] Inventors: Aiko Nishino; Hisashi Iwamoto, both of Hyogo, Japan

[73] Assignees: Mitsubishi Denki Kabushiki Kaisha; Mitsubishi Electric Engineering Company Limited, both of Tokyo, Japan

[21] Appl. No.: 09/120,031

[22] Filed: Jul. 21, 1998

[30] Foreign Application Priority Data

Jan. 30, 1998 [JP] Japan .................. 10-019372

[51] Int. Cl.[7] .................................. G11C 8/00
[52] U.S. Cl. ...................... 365/233; 365/189.05
[58] Field of Search ............... 365/233, 189.05, 365/230.08, 192

[56] References Cited

U.S. PATENT DOCUMENTS

| | | | |
|---|---|---|---|
| 5,404,338 | 4/1995 | Murai et al. | 365/233 |
| 5,535,171 | 7/1996 | Kim et al. | 365/233 |
| 5,933,379 | 8/1999 | Park et al. | 365/233 |
| 5,953,286 | 9/1999 | Matsubara et al. | 365/233 |
| 5,959,900 | 9/1999 | Matsubara | 365/233 |

FOREIGN PATENT DOCUMENTS 7-262777  10/1995  Japan .

*Primary Examiner*—Son T. Dinh
*Attorney, Agent, or Firm*—McDermott, Will & Emery

[57] ABSTRACT

An output circuit and a synchronous semiconductor memory device according to the invention suppress output of invalid data, and perform data output with exact timings. The synchronous semiconductor memory device includes a plurality of output buffers provided correspondingly to data I/O terminals, a plurality of data transfer latch circuits and a plurality of output control signal latch circuits. Data transfer latch circuit transfers data read from a memory cell to the corresponding output buffer in response to an internal clock signal. The output control signal latch circuit issues an output control signal to the corresponding output buffer in synchronization with the internal clock signal. Thereby, an output timing of each output buffer can be controlled independently of the other output buffer.

8 Claims, 24 Drawing Sheets

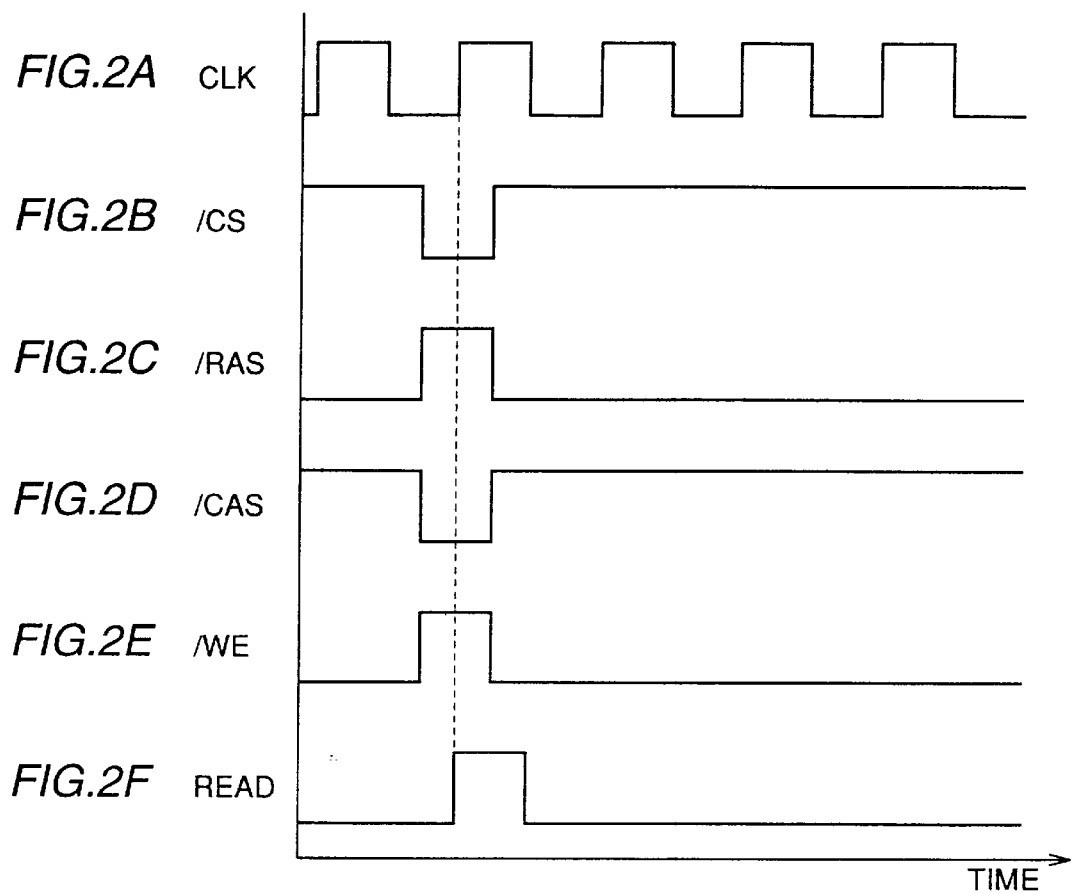
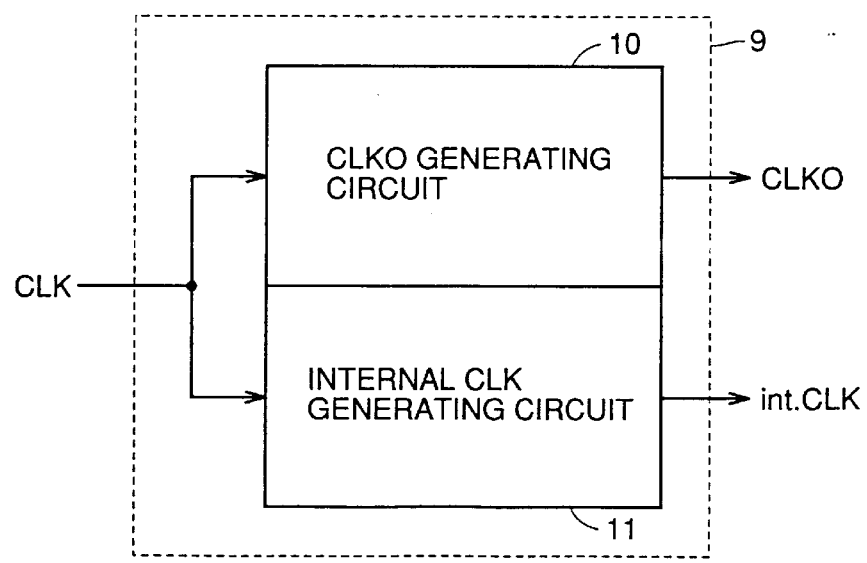

FIG.13
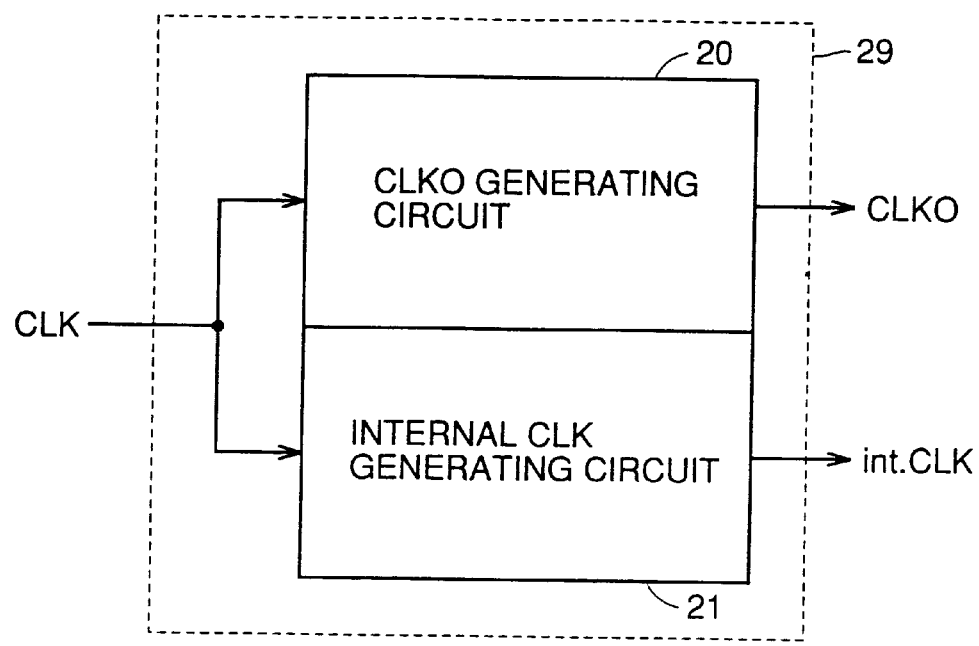
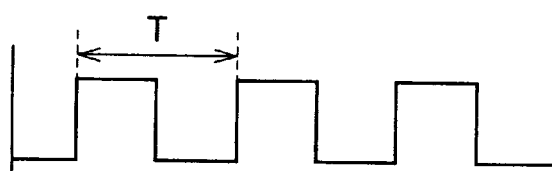
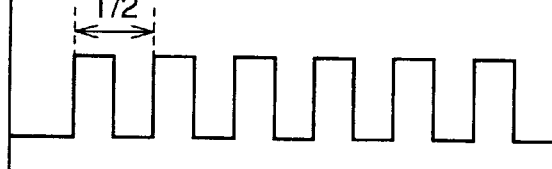
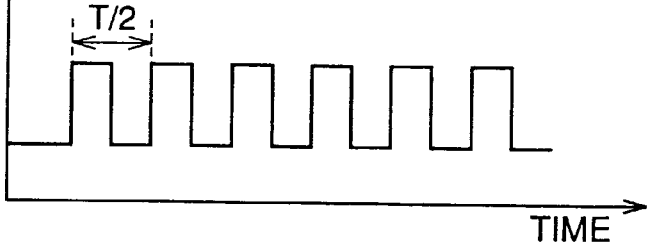

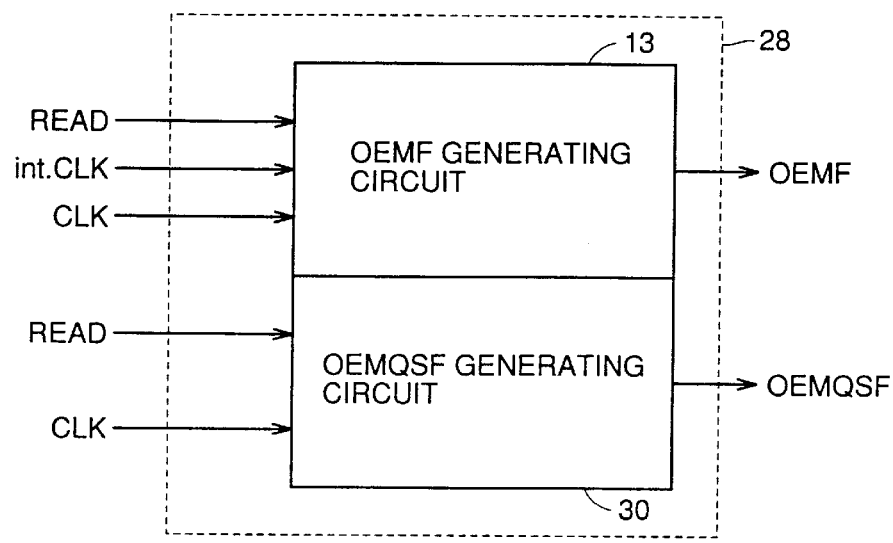
FIG.15
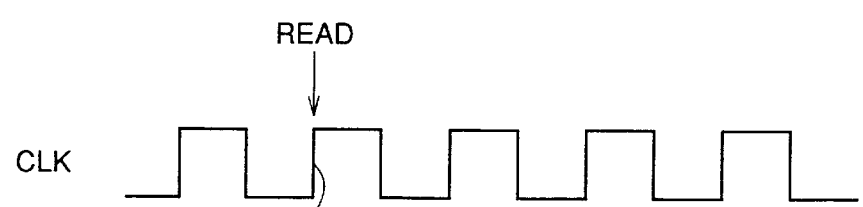
FIG.16A CLK
FIG.16B OEMQSF

FIG. 24 PRIOR ART
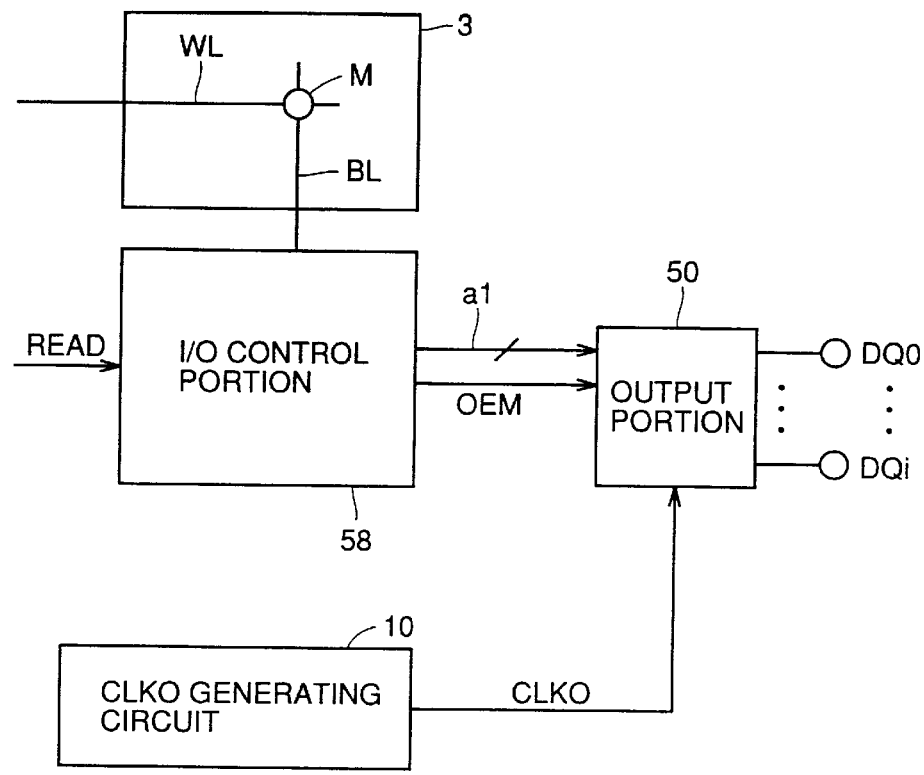
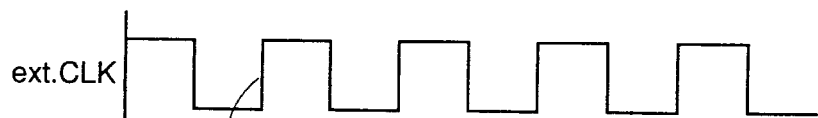
FIG.25A PRIOR ART — ext.CLK
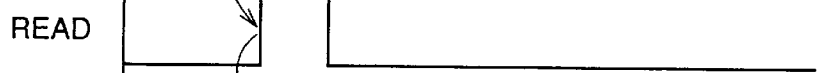
FIG.25B PRIOR ART — READ
FIG.25C PRIOR ART — OEMF
FIG.25D PRIOR ART — CLKO
FIG.25E PRIOR ART — OEM
TIME

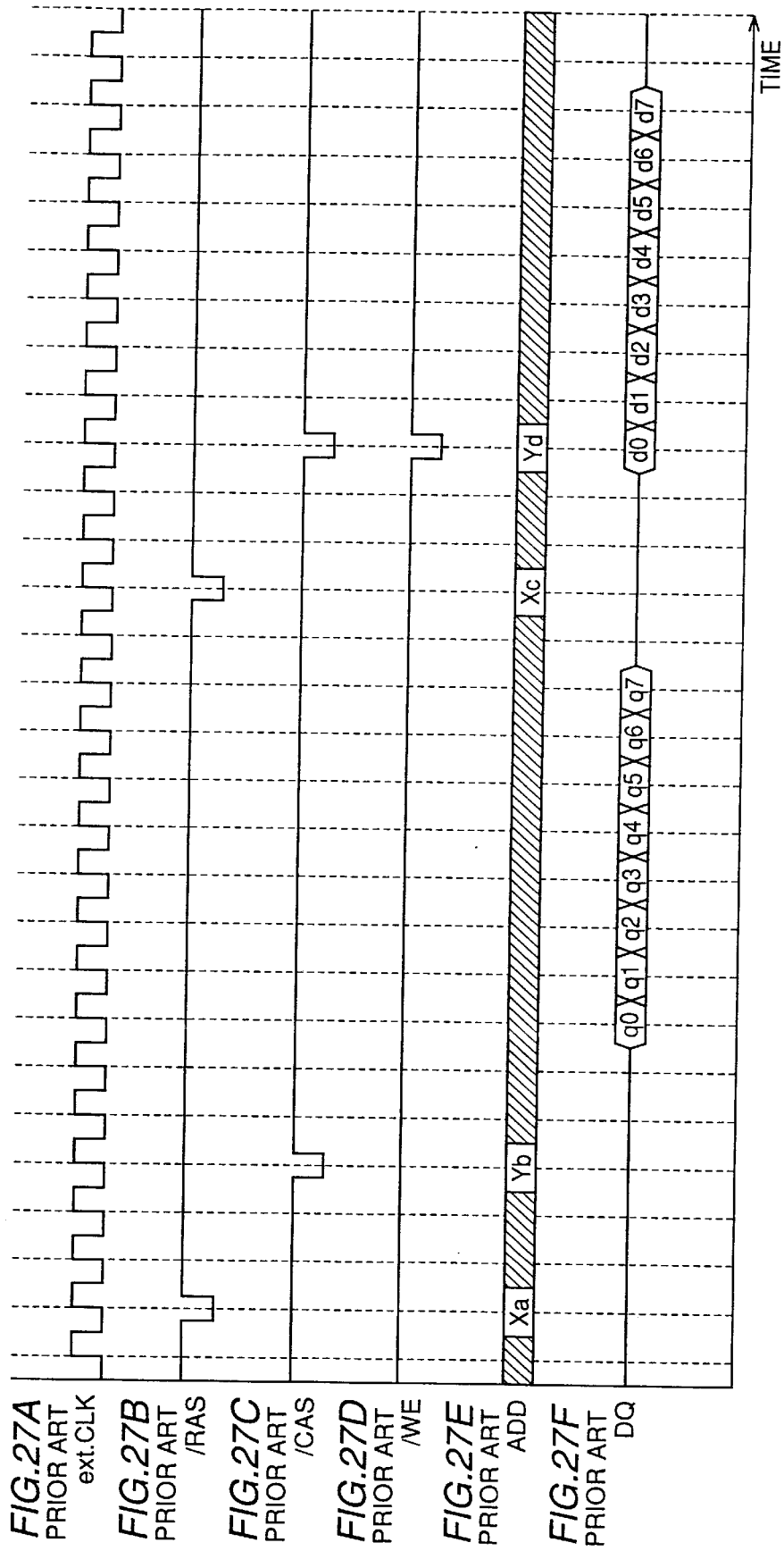

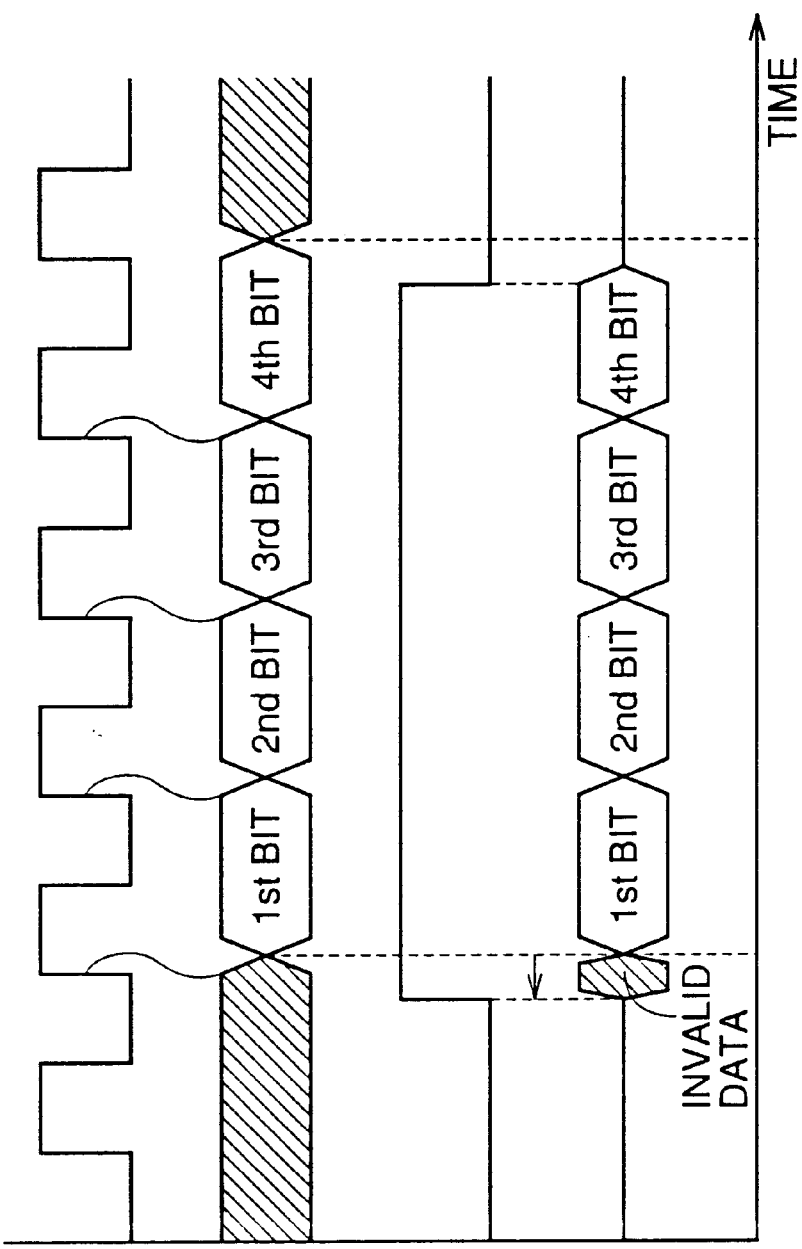

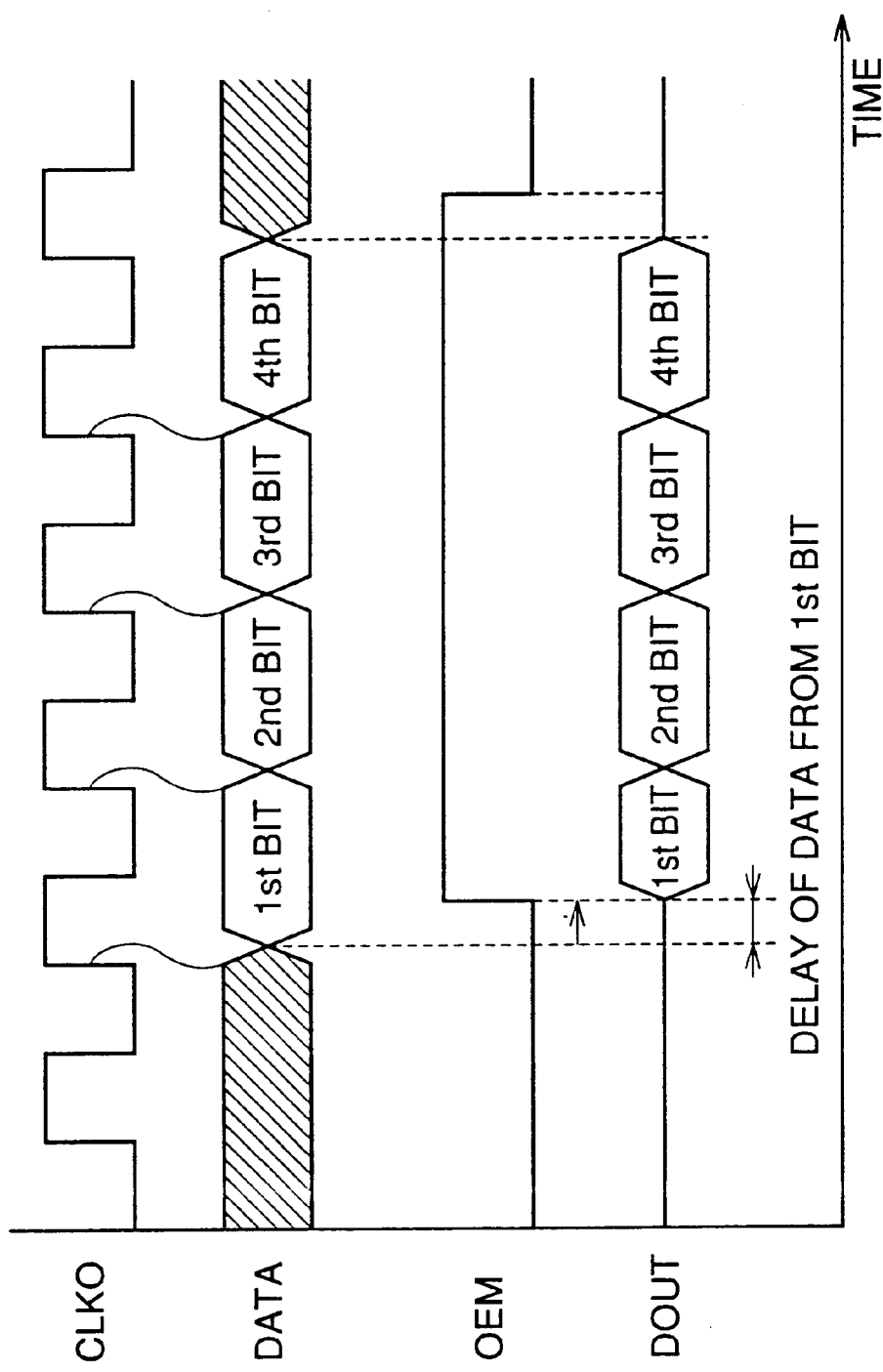
FIG.29A PRIOR ART CLKO
FIG.29B PRIOR ART DATA
FIG.29C PRIOR ART OEM
FIG.29D PRIOR ART DOUT

OUTPUT CIRCUIT AND SYNCHRONOUS SEMICONDUCTOR MEMORY DEVICE HAVING A FUNCTION OF PREVENTING OUTPUT OF INVALID DATA

BACKGROUND OF THE INVENTION

1. Field of the Invention

The present invention relates to an output circuit and a synchronous semiconductor memory device which operate in response to a clock signal, and particularly relates to an output circuit and a synchronous semiconductor memory device which can externally transfer data according to accurate timings.

2. Description of the Background Art

In recent years, synchronous DRAMs (which will be referred to as "synchronous semiconductor memory devices" hereinafter) operating in synchronization with a clock signal have been used as main storages for fast MPUs.

A conventional synchronous semiconductor memory device will be described below with reference to FIG. 24. As shown in FIG. 24, a conventional synchronous semiconductor memory device 900 includes a memory cell array 3, an I/O control portion 58, an output portion 50 and a CLKO generating circuit 10.

Memory cell array 3 includes a plurality of memory cells M arranged in rows and columns, a plurality of word lines WL arranged correspondingly to the rows, respectively, and a plurality of bit lines BL arranged correspondingly to the columns, respectively.

CLKO generating circuit 10 is responsive to an external clock signal (which will be referred to as an "external clock signal ext.CLK") sent from an external controller (not shown) to output an output clock CLKO (i.e., a clock for output) controlling an operation of output portion 50 which will be described later. CLKO generating circuit 10 is formed of, e.g., a DLL circuit or a PLL circuit.

I/O control portion 58 transfers externally applied input data to memory cell array 3, and transfers data read from memory cell array 3 to output portion 50. I/O control portion 58 generates an output control signal OEM controlling an output operation of output portion 50. Output portion 50 is responsive to output control signal OEM to transmit output data, which corresponds to the read data, to data I/O terminals DQ0, - - -, DQi (where i is an integer larger than 1).

An operation of I/O control portion 58 shown in FIG. 24 will be described below with reference to timing charts of FIG. 25A–FIG. 25E. As shown in FIGS. 25A–25E, I/O control portion 58 is responsive to a read command READ, which is externally taken in, to generate a control signal OEMF at H-level synchronized with a system clock, i.e., external clock signal ext.CLK (or a clock signal which is an internal signal corresponding to external clock signal ext.CLK). By synchronizing control signal OEMF with output clock signal CLKO, output control signal OEM which is at H-level and therefore active is generated. In a continuous read operation mode, which will be described later, output control signal OEM holds H-level for a period of a length of effective data (i.e., a burst length BL) which is continuously read.

Conventional output portion 50 shown in FIG. 24 will be described below. Conventional output portion 50 has a structure, which is specifically disclosed, for example, in "Data Output Buffer" (Japanese Patent Laying-Open No. 7-262777 (1995)).

An example of the structure of output portion 50 in the prior art will be described below with reference to FIG. 26.

FIG. 26 shows an example of a structure of a major portion of conventional output portion 50, and also shows a relationship thereof with respect to OEM generating circuit 52 included in I/O control portion 58.

As shown in FIG. 26, conventional output portion 50 includes a plurality of buffers. FIG. 26 representatively shows output buffers 56.0, 56.1, - - -, 56.15, which will be generally referred to as output buffers 56 hereinafter. Output buffers 56 are connected to corresponding data I/O terminals DQ0, DQ1, - - -, DQ15, respectively, which will be generally referred to as data I/O terminals DQ hereinafter.

Output portion 50 further includes a plurality of latch circuits for transferring read data. FIG. 26 representatively shows, as the latch circuits for read data transfer, latch circuits 54.0, 54.1, - - -, 54.15, which will be generally referred to as data transfer latch circuits 54 hereinafter.

Each of data transfer latch circuit 54 and OEM generating circuit 52 included in I/O control portion 58 is a latch circuit of edge trigger, and takes in a signal, which is received on an input node in, at the falling edge of a signal received on an input node ck. Also, it outputs the signal thus taken at the rising edge of the signal received on input node ck. OEM generating circuit 52 issues output control signal OEM by synchronizing control signal OEMF with output clock signal CLKO.

Output portion 50 is supplied with read data RD(0), RD(1), - - -, RD(15) through data line al. Each data transfer latch circuit 54 receives corresponding read data RD(0), RD(1), - - -, RD(15) on its input, and issues corresponding data DATA(0), DATA(1), - - -, DATA(15), which will be generally referred to as data DATA hereinafter, in response to the rising timing of output clock signal CLKO.

Output buffers 56 receive corresponding data DATA from corresponding data transfer latch circuits 54, and transfer data DOUT (which are represented as DOUT(0), DOUT(l), . . . , DOUT(15) in FIG. 26) to corresponding data I/O terminals DQ based on output control signal OEM, respectively.

A continuous read operation and a continuous write operation in conventional synchronous semiconductor memory device 900 will be briefly described below with reference to timing charts of FIGS. 27A–27F. FIGS. 27A–27F are standard timing charts showing relationships between various signals satisfying the specifications for fast access in conventional synchronous semiconductor memory device 900.

FIGS. 27A–27F are timing charts of the write operation for writing continuous 8-bit data (data of 64(=8×8 bits in total), which is read from the memory cells, from each of eight data I/O terminals DQ.

As shown in FIGS. 27A–27F, conventional synchronous semiconductor memory device 900 takes in external control signals (e.g., an external row address signal /RAS and others) as well as an address signal ADD, for example, at the rising edge of external clock signal ext.CLK which is the system clock. As address signal ADD, a row address signal X and a column address signal Y are applied in a time-division multiplexing manner.

At the rising edge of external clock signal ext.CLK, address signal ADD at this point of time is taken in as a row address signal (Xa in FIG. 27) if external row address strobe signal /RAS is active (at L-level), external column address strobe signal /CAS is inactive (at H-level) and external write enable signal /WE is inactive (at H-level).

At the rising edge of external clock signal ext.CLK, address signal ADD at this point of time is taken in as a column address signal (Yb in FIG. 27) if external column address strobe signal /CAS attains the active state (L-level). In accordance with row and column address signals Xa and Yb thus taken, the operation of selecting the row and column in the memory cell array of the synchronous semiconductor memory device is conducted.

When a predetermined clock period (equal to 3 clock cycles in FIG. 27) elapses after external column address strobe signal /CAS falls to L-level, initial 8-bit data (q0 in FIG. 27) is output. A period from the falling of internal column address strobe signal /CAS to L-level to the output of the initial data is called a CAS latency. In FIG. 27, since the data is output after 3 clock cycles, the CAS latency is 3. Thereafter, data q1, - - - , q7 is output in response to the rising of external clock signal ext.CLK so that the data of 64(8×8) bits in total is output for 8 clock cycles.

In the continuous read operation, as described above, the access time for the first bit (i.e., the time from rising of external clock signal ext.CLK to actual output of data DOUT) depends on output control signal OEM and output clock signal CLKO, and the data access times for second and subsequent data depend on only output clock signal CLKO.

In the write operation, a row address signal (Xc in FIG. 27) and a column address signal (Yd in FIG. 27) are taken in similarly to the read operation. In response to them, the row and column are selected. Externally applied data (d0 among d0, - - - , d7 in FIG. 27) is taken, as initial write data, into the memory cell corresponding to the selected row and column. As described above, conventional synchronous semiconductor memory device 900 achieves the fast access by performing the continuous reading and continuous writing.

In conventional synchronous semiconductor memory device 900, since a shift occurs in output timing of the data as described above, a failure may occur in an operation of taking in data by an external controller which receives the output data. Brief description will be further given on this problem with reference to FIGS. 28A–28D and 29A–29D.

First, each data transfer latch circuit 54 is arranged immediately before corresponding output buffer 56, and OEM generating circuit 52 generating output control signal OEM is arranged at a position spaced from each output buffer 56. Therefore, the timing with which the output of data transfer latch circuit 54 arrives at output buffer 56 shifts from the timing with which output control signal OEM arrives at output buffer 56.

If output control signal OEM arrives at output buffer 56 before the arrival of data DATA (see FIGS. 28A–28D), invalid data will be output (see the hatched portion in FIG. 28D).

Secondly, in the continuous read operation, the data access time for the first bit depends on output control signal OEM and output clock signal CLKO, but the data access times for second and subsequent bits depend on only output clock signal CLKO.

Therefore, when data DATA arrives at output buffer 56 before output control signal OEM (see FIGS. 29A–29D), a difference occurs between the data access time for the first bit and the data access time for the second bit.

Thirdly, output control signals OEM arrive at output buffers 56 with different timings, respectively, so that a difference (a skew) occurs in access time between data I/O terminals DQ.

As a result, the external controller cannot receive the data according to adequate timing, and cannot reliably perform a correct operation.

Accordingly, an object of the invention is to provide an output circuit which can output data without causing a shift in output timing.

Another object of the invention is to provide a synchronous semiconductor memory device provided with an output circuit which can output data without causing a shift in output timing.

Still another object of the invention is to provide a synchronous semiconductor memory device which allows exact data transfer while suppressing a skew between data I/O terminals.

Yet another object of the invention is to provide a synchronous semiconductor memory device which can minutely adjust a timing of data output independently of an external clock signal.

SUMMARY OF THE INVENTION

A synchronous semiconductor memory device according to the invention includes a circuit for taking in an external signal applied in synchronization with an external clock signal formed of a pulse train; an internal clock signal generating circuit for generating an internal clock signal synchronized with the external clock signal; a plurality of memory cells; a plurality of data output terminals; a read circuit for reading data from the plurality of memory cells in response to a read command based on the external signal; a plurality of output buffers provided correspondingly to the plurality of data output terminals for transmitting output data corresponding to the read data to the corresponding data output terminals, respectively; a plurality of data transfer circuits provided correspondingly to the plurality of output buffers for transferring the data read by the read circuit to the output buffers in response to the internal clock signal, respectively; a control circuit for generating a control signal in response to the read command; and a plurality of output control signal generating circuits provided correspondingly to the plurality of output buffers each for generating an output control signal enabling the transmitting operation of the corresponding output buffers in response to the control signal and the internal clock signal, and outputting the generated output control signal to the corresponding output buffers.

According to the above aspect of the invention, the plurality of data transfer circuits for transferring the data read from the memory cells to the corresponding output buffers as well as the plurality of output control signal generating circuits for generating the output control signal operating the corresponding output buffers are provided for the plurality of output buffers transmitting the data read from the memory cells to the data output terminals, respectively. Therefore, such an advantage can be achieved that the operations of the output buffers can be individually controlled. As a result, the external device can correctly take in the data from the synchronous semiconductor memory device.

In particular, a signal interconnection of each of the output buffers for receiving the data from the corresponding data transfer circuit may have a length substantially equal to that of a signal interconnection of the same output buffer for receiving the output control signal from the corresponding output control signal generating circuit. Thereby, it is possible to prevent a shift between a transfer timing of the data and a transfer timing of the control signal, and therefore can prevent output of invalid data.

Further, all signal interconnections for supplying the outputs of the plurality of data transfer circuits to the corresponding output buffers, respectively, may have lengths substantially equal to those of signal interconnections for supplying the outputs of the plurality of output control signal generating circuits to the corresponding output buffers, respectively. This can prevent a difference in access time between the data I/O terminals.

Particularly in connection with the plurality of data transfer circuits operating in synchronization with the internal clock signal and the plurality of output control signal generating circuits, signal interconnections for supplying the internal clock signal to the plurality of data transfer circuits may be substantially equal in length to signal interconnections for supplying the internal clock signal to the plurality of output control signal generating circuits. This allows output of the data from each output buffer with an intended timing, and also allows output of the data from the plurality of output buffers with the same timing.

According to another aspect of the invention, an output circuit includes a plurality of data latch circuits for latching and outputting input data in synchronization with a clock signal formed of a series of pulse trains; a plurality of output buffers provided correspondingly to the plurality of data latch circuits for receiving the outputs of the data latch circuits and issuing corresponding outputs data, respectively; control circuits for issuing control signals controlling output operations of the plurality of output buffers, respectively; and output control signal generating circuits provided correspondingly to the plurality of output buffers for issuing output control signals enabling the output operations of the corresponding output buffers to the corresponding output buffers in response to the control signal and the clock signal.

According to the above aspect of the invention, the output circuit is provided with the plurality of data latch circuits for latching and transferring the data, the plurality of output buffers for outputting the data in response to the transferred data, and the plurality of output control signal generating circuits for generating the output control signals controlling the operations of the plurality of output buffers, respectively. Thus, one data latch circuit and one output control signal generating circuit are provided for one output buffer. Therefore, such an advantage can be achieved that the operations of the output buffers can be individually controlled.

In particular, a signal interconnection of each of the output buffers for receiving the data from the corresponding data latch circuit may have a length substantially equal to that of a signal interconnection of the same output buffer for receiving the output control signal from the output control signal generating circuit. Thereby, it is possible to prevent a shift between a transfer timing of the data and a transfer timing of the control signal, and therefore can prevent output of invalid data.

Further, all signal interconnections for supplying the outputs of the plurality of data latch circuits to the corresponding output buffers, respectively, may have lengths substantially equal to those of the signal interconnections for supplying the outputs of the plurality of output control signal generating circuits to the corresponding output buffers. This allows output of the data from the plurality of output buffers with the same timing.

According to still another object of the invention, a synchronous semiconductor memory device for outputting output data to an external controller in response to a read command includes a taking circuit for taking in an externally applied external signal in synchronization with an external clock signal formed of a series of pulse trains; an internal clock signal generating circuit for generating an internal clock signal synchronized with the external clock signal; a plurality of memory cells; a read circuit for reading data from the plurality of memory cells in response to a read command based on the external signal; a transfer control circuit for issuing, in response to the read command, to the controller a data transfer control signal including a synchronous signal portion synchronized with the internal clock signal for instructing the controller to receive the output data and a standby signal portion located at a leading position of the synchronous signal and holding an active state at a constant level for a period of at least one clock for instructing the controller to stand by; and an output buffer for outputting to the controller the output data corresponding to the read data in synchronization with the internal clock signal.

According to the above aspect, the data is transmitted to the external controller. Also, the transfer control circuit issues, in accordance with the output timing of the data, the data transfer control signal (data strobe signal) formed of the standby signal, which holds the active state at the constant level for at least one-clock period for instructing standby for reception of the data, and the synchronous signal specifying the timing of the data reception. Thereby, the invention can further achieve such an advantage that the external controller side can accurately receive the output data without being affected by a delay or the like of the internal clock signal which is generated within the synchronous semiconductor memory device.

In particular, the synchronous signal may be generated during the active period of the output control signal, and a circuit for adjusting a phase of the internal clock may be used to adjust the activating timing of the standby signal with the internal clock signal having the adjusted phase. Thereby, the data transfer control signal can be activated with an intended timing. Consequently, an external controller can receive, with a constant timing, the data and the data transfer control signal for receiving the data even when a remarkable shift occurs between the external clock signal and the internal clock signal.

In particular, even if a data transfer rate is doubled (i.e., if the synchronous semiconductor memory device is of a DDR type), an external controller can receive, with a constant timing, the data and the data transfer control signal for receiving the data.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A–2F are timing charts showing an example of an operation of a command decoder 7 shown in FIG. 1;

FIG. 3 is a block diagram schematically showing an example of a structure of a major portion of a CLK generating circuit 9 shown in FIG. 1;

FIG. 13 is a block diagram showing an example of a structure of a CLK generating circuit 29 shown in FIG. 11;

FIGS. 14A–14C are timing charts showing an operation of the CLK generating circuit 29 shown in FIG. 13;

FIG. 15 is a block diagram showing an example of a specific structure of an I/O control portion 28 shown in FIG. 12;

FIGS. 16A and 16B are timing charts showing an operation of an OEMQSF shown in FIG. 15;

FIG. 24 shows a structure of a major portion of a synchronous semiconductor memory device 900 in the prior art;

FIGS. 25A–25E are timing charts showing an operation of the I/O control portion 58 shown in FIG. 24;

FIGS. 27A–27F are standard timing charts showing relationships between various signals satisfying specifications for fast access in the synchronous semiconductor memory device 900 in the prior art;

FIGS. 28A–28D are timing charts showing a problem associated with data output timing in the synchronous semiconductor memory device 900 in the prior art; and FIGS. 29A–29D are timing charts showing the problem associated with the data output timing in the synchronous semiconductor memory device 900 in the prior art.

DESCRIPTION OF THE PREFERRED EMBODIMENTS

Embodiment 1

Figure 1:
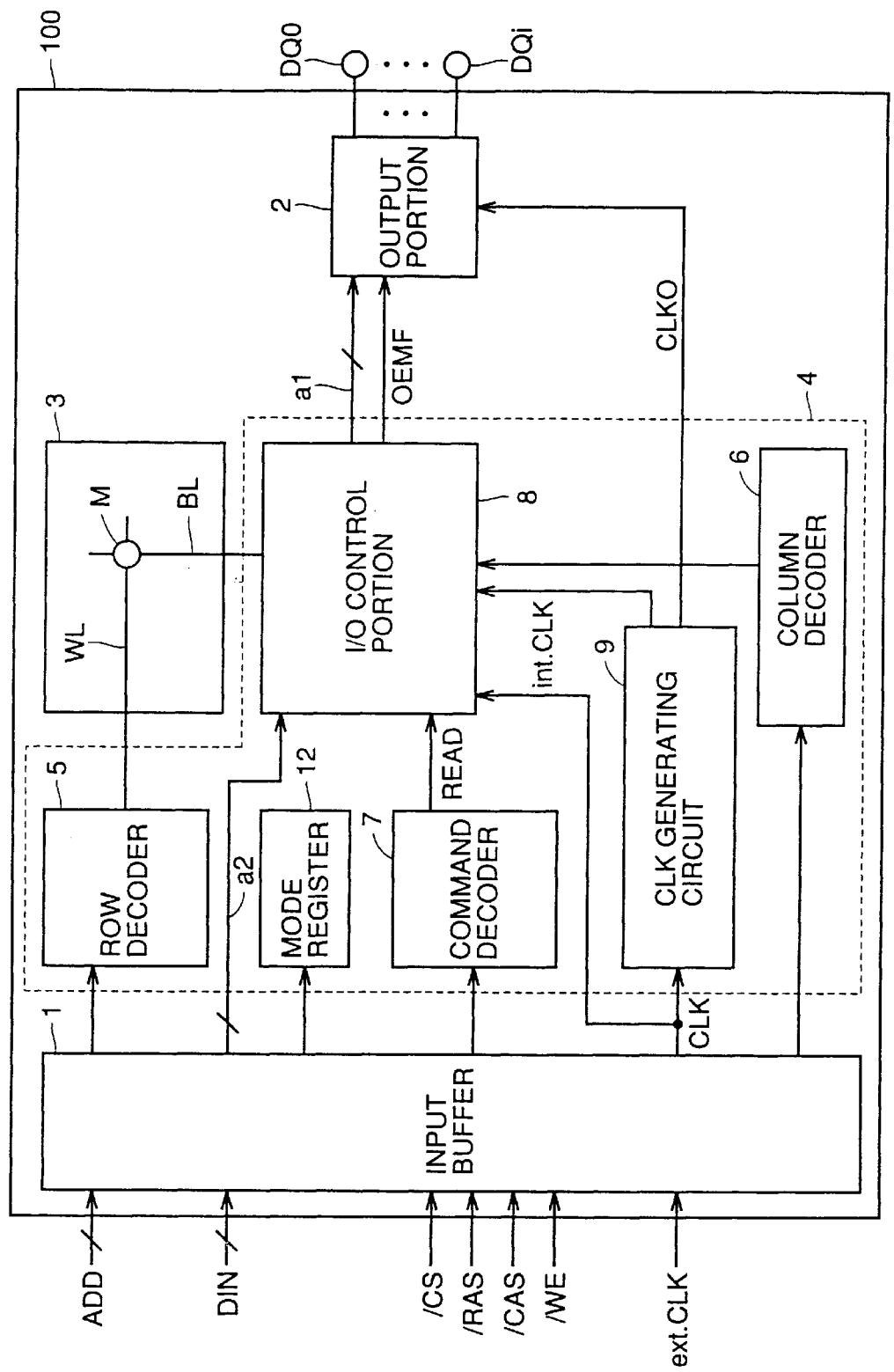
FIG. 1 is a block diagram schematically showing a whole structure of a synchronous semiconductor memory device 100 of an embodiment 1 of the invention.

A whole structure of a synchronous semiconductor memory device 100 of an embodiment 1 of the invention will be described below with reference to FIG. 1.

The same components as those in conventional synchronous semiconductor memory device 900 bear the same reference numbers or characters, and will not be described below. Synchronous semiconductor memory device 100 shown in FIG. 1 includes an input buffer 1, an output portion 2, a memory cell array 3 and a peripheral circuit 4.

Input buffer 1 externally receives an address signal ADD, an input data DIN, an external clock signal ext.CLK and external control signals (external chip select signal /CS, external row address strobe signal /RAS, external column address strobe signal /CAS, external write enable signal /WE and others), and outputs them to peripheral circuit 4 after converting the voltage levels thereof into internal potential levels. A clock signal CLK is issued based on external clock signal ext.CLK.

Memory cell array 3 includes a plurality of memory cells M arranged in rows and columns, a plurality of word lines WL arranged correspondingly to the rows, respectively, and a plurality of bit lines BL arranged correspondingly to the columns, respectively, as already described.

Peripheral circuit 4 includes a row decoder 5, a column decoder 6, a command decoder 7, a mode register 12, an I/O control portion 8 and a CLK generating circuit 9.

Row decoder 5 receives a row address signal issued from input buffer 1 in response to address signal ADD, and sets corresponding word line WL to the selected state. Column decoder 6 receives the column address signal issued from input buffer 1 in response to address signal ADD, and sets corresponding bit line BL to the selected state. Thereby, memory cell M located on the crossing between selected word line WL and selected bit line BL attains the selected state.

In the read and write operations, command decoder 7 sends a control command to I/O control portion 8, and writing of data into the selected memory cell or external output of the data read from the memory cell is performed in response to the control command. In the write operation, I/O control portion 8 receives the data corresponding to input data DIN from input buffer 1 through an I/O line a2. In the read operation, I/O control portion 8 transmits the data read from the selected memory cell to output portion 2 through an I/O line a1. Output portion 2 transmits output data corresponding to the read data to data I/O terminals DQ0, - - - , DQi (i is an integer more than one) in response to an output control signals OEM, which will be described later.

Description will be given on command decoder 7 shown in FIG. 1. Command decoder 7 receives internal control signals corresponding to the external control signals from input buffer 1, and outputs a control command operating peripheral circuit 4 in response to the internal control signals.

An example of the operation of command decoder 7 shown in FIG. 1 will be described below with reference to timing charts of FIGS. 2A through 2F. As shown in FIGS. 2A through 2F, command decoder 7 issues a read command READ (one-shot pulse) controlling the read operation of memory cell array 3 if external row address strobe signal /RAS and external write enable signal /WE are at H-level, and external chip select signal /CS and external column address strobe signal /CAS are at L-level at the rising timing of clock signal CLK (or external clock signal ext.CLK). 4

CLK generating circuit 9 shown in FIG. 1 will be described below with reference to FIG. 3. As shown in FIG. 3, CLK generating circuit 9 includes a CLKO generating circuit 10 and an internal CLK generating circuit 11.

CLKO generating circuit 10 receives clock signal CLK, and issues an output clock signal CLKO controlling an operation of output portion 2. Internal CLK generating circuit 11 receives clock signal CLK, and generates an internal clock signal int.CLK controlling internal operations of peripheral circuit 4 including I/O control portion 8 and others. CLKO generating circuit 10 and internal CLK generating circuit 11 are made of, e.g., DLL circuits or PLL circuits.

Mode register 12 shown in FIG. 1 sets the mode in response to the signal sent from input buffer 1. More specifically, it outputs a burst length BL representing the number of effective data to be externally and continuously output, and a CAS latency CSL representing the number of clocks from application of read command READ to start of actual output of the data.

Figure 4:
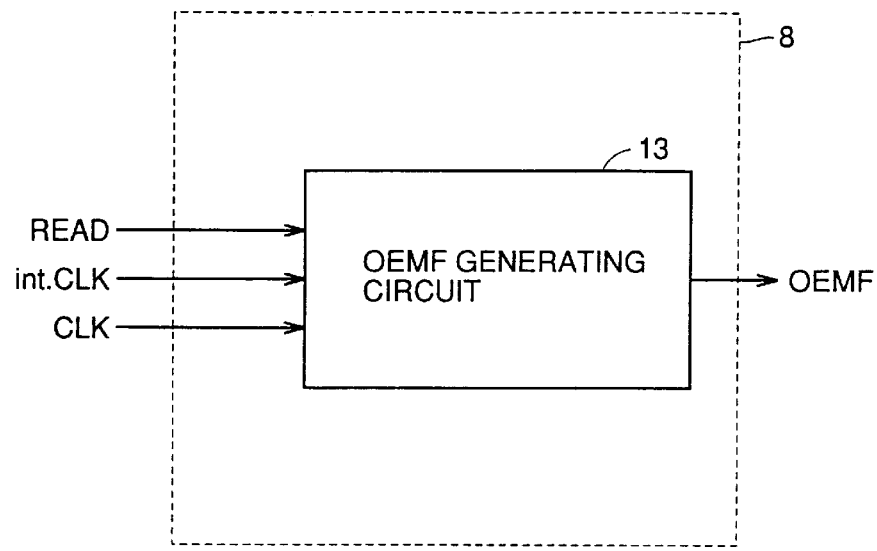
FIG. 4 is a block diagram schematically showing an example of a structure of a major portion of an I/O control portion 8 shown in FIG. 1.

I/O control portion 8 shown in FIG. 1 will be described below with reference to FIG. 4. As shown in FIG. 4, I/O control portion 8 includes an OEMF generating circuit.13.

OEMF generating circuit 13 responds to clock signal CLK, internal clock signal int.CLK and read command READ by issuing a control signal OEMF for controlling the output operation of output portion 2 which will be described later.

A specific structure and an operation of OEMF generating circuit 13 will be described below with reference to a circuit diagram of FIG. 5 and timing charts of FIGS. 6A through 6F.

Figure 5:
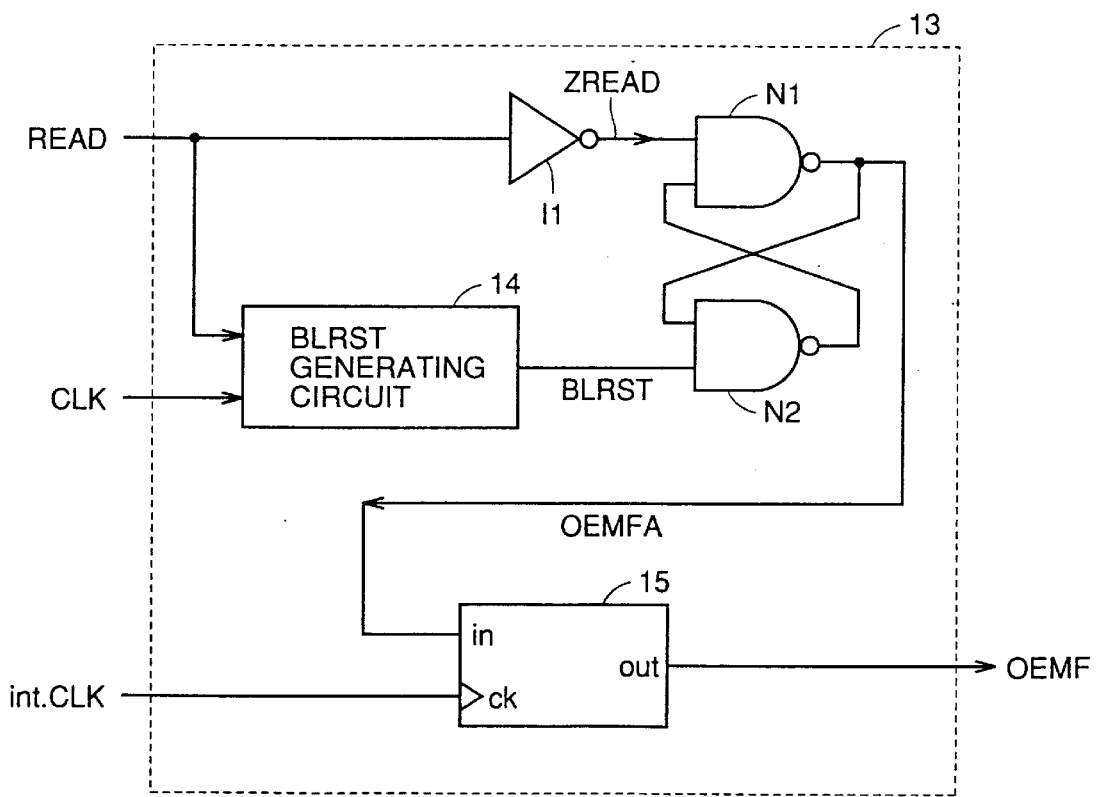
FIG. 5 shows an example of a specific structure of an OEMF generating circuit 13 shown in FIG. 4.

As shown in FIG. 5, OEMF generating circuit 13 includes a BLRST generating circuit 14, a latch circuit 15, an inverter circuit I1 and NAND circuits N1 and N2.

Figure 6:
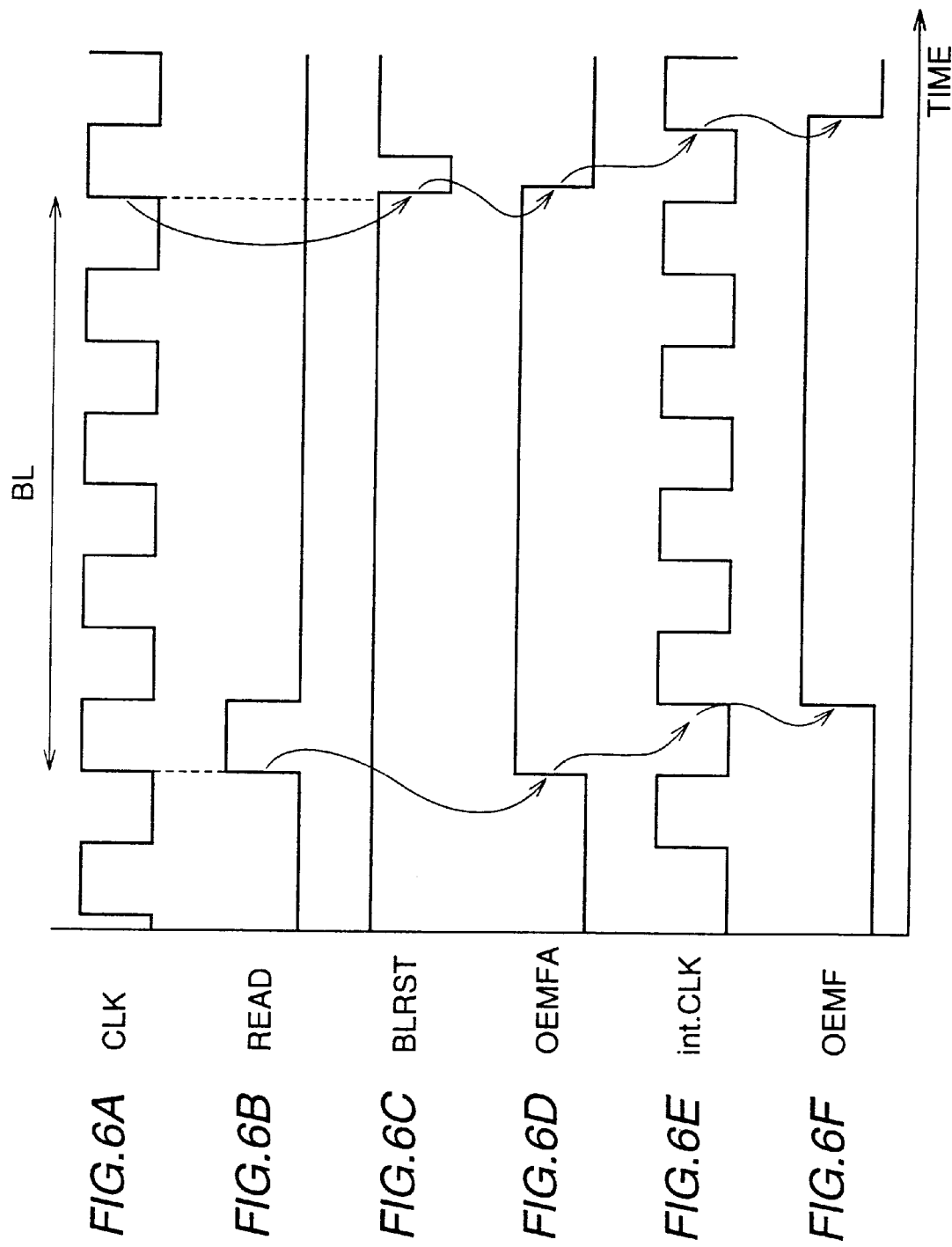
FIGS. 6A–6F are timing charts showing an operation of the OEMF generating circuit 13 shown in FIG. 5.

BLRST generating circuit 14 includes a counter (not shown), and operates based on clock signal CLK to count the length (i.e., burst length BL) of effective data to be read continuously and output a burst length reset signal BLRST (see FIG. 6C).

Inverter circuit I1 outputs an inverted read command ZREAD produced by inverting read command READ. NAND circuits N1 and N2 form a flip-flop circuit. NAND circuit N1 receives inverted read command ZREAD and the output of NAND circuit N2 on its inputs. NAND circuit N2 receives burst length reset signal BLRST and the output of NAND circuit N1 on its inputs. Thereby, a control signal OEMFA which holds H-level for a period corresponding to burst length BL is issued from the output node of NAND circuit N1 (see FIG. 6D).

Latch circuit 15 is a latch circuit of edge trigger, and generates control signal OEMF by synchronizing received control signal OEMFA with internal clock signal int.CLK. Control signal OEMF determines the active period of output control signal OEM.

An example of a specific structure of latch circuit 15 of the edge trigger shown in FIG. 5 will now be described below with reference to FIG. 7. Latch circuit 15 shown in FIG. 7 includes inverter circuits I2, I3, I4 and I5 as well as gate circuits G1 and G2, and a transfer gate TG1.

Inverter I2 outputs an inverted signal ZC produced by inverting a signal C received on a node ck. Gate circuit GI inverts a signal received on its input node and outputs the result when signal C is at L-level (inverted signal ZC is at H-level).

An input node of inverter circuit I3 is connected to output nodes of gate circuits G1 and G2. Gate circuit G2 inverts the output signal of inverter circuit I3 and outputs the result when signal C is at H-level (inverted signal ZC is at L-level). Inverter circuit I3 and gate circuit G2 form a latch circuit. Inverter circuit I3 inverts the received signal and outputs the result. Inverter circuit I4 the output signal of inverter circuit I3 inverts and outputs the result.

Transmission gate TG1 sends the output signal of inverter I4 to inverter circuit I5 when signal C is at H-level (inverted signal ZC is at L-level).

The input node of inverter circuit I5 is connected to the output nodes of transmission gate TG1 and gate circuit G3. Gate circuit G3 inverts the output signal of inverter circuit I5 and outputs the result when signal C is at L-level (inverted signal ZC is at H-level). Inverter circuit I5 and gate circuit G3 form a latch circuit. Inverter circuit I5 inverts the received signal and outputs the result to an output node out.

Latch circuit 15 in OEMF generating circuit 13 shown in FIG. 5 receives control signal OEMFA and internal clock signal int.CLK on its input nodes in and ck, respectively, and outputs control signal OEMF from its output node out.

Figure 8:
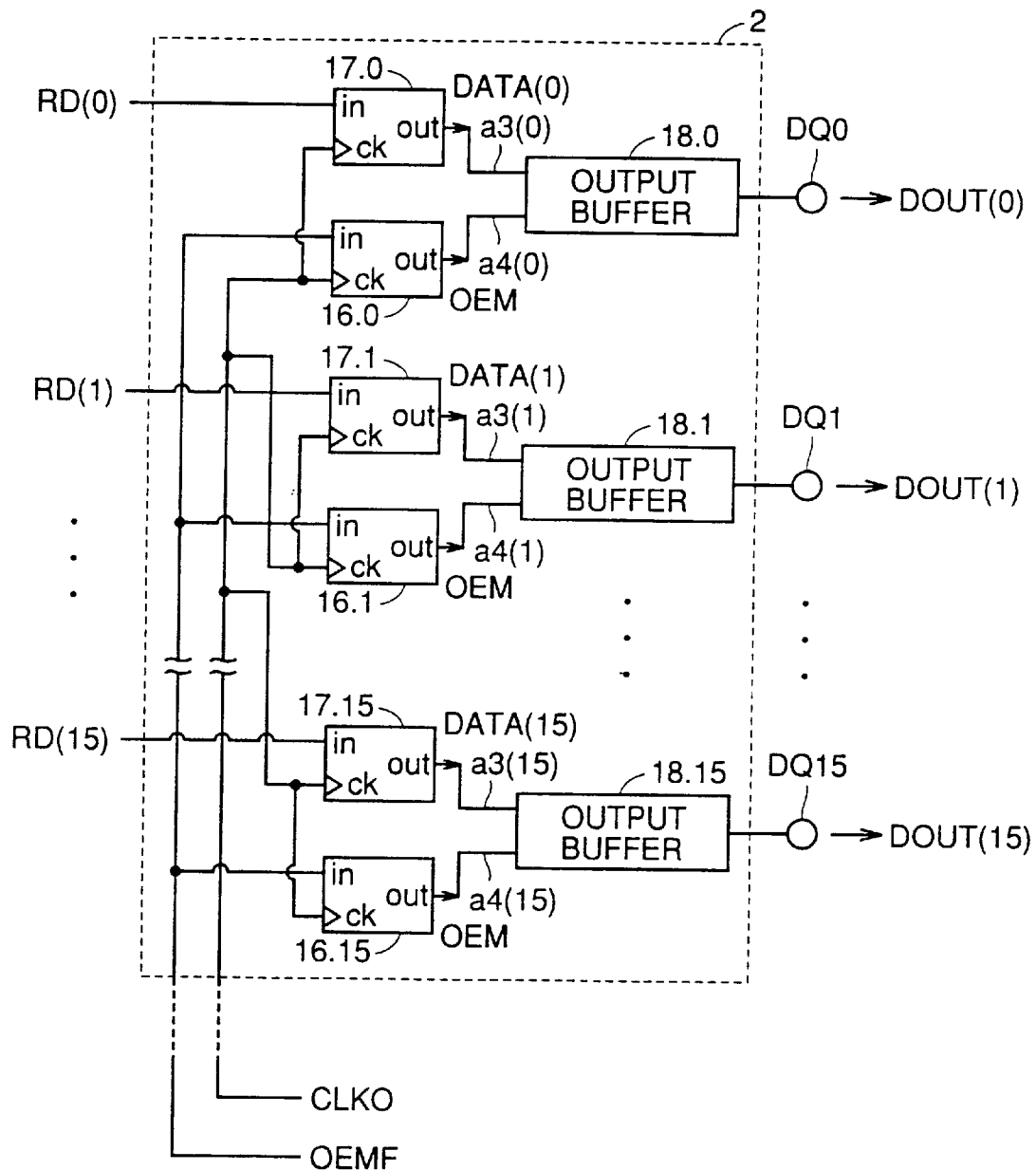
FIG. 8 is a block diagram showing an example of a specific structure of an output portion 2 shown in FIG. 1.

A specific structure of output portion 2 shown in FIG. 1 will be described below with reference to FIG. 8. As shown in FIG. 8, output portion 2 includes a plurality of output buffers corresponding to data I/O terminals DQ, respectively. FIG. 2 representatively shows output buffers 18.0, 18.1, - - - , 18.15 (which will be generally referred as an output buffers 18, hereinafter) corresponding to data I/O terminals DQ0, DQ1, - - - , DQ15, respectively.

Output portion 2 shown in FIG. 8 further includes a plurality of latch circuits for transferring read data and a plurality of latch circuits for generating an output control signal. FIG. 8 representatively shows latch circuits 17.0, 17.1, - - - , 17.15 (which will be generally referred to as data transfer latch circuits 17 hereinafter) as the latch circuits for transferring the read data. Also, latch circuits 16.0, 16.1, - - - , 16.15 (which will be generally referred to as output control signal latch circuits 16 hereinafter) are representatively shown as the latch circuits for generating the output control signal. Specific structures of output control signal latch circuit 16 and data transfer latch circuit 17 are the same as that of latch circuit 15 shown in FIG. 7.

Each data transfer latch circuit 17 is arranged immediately before corresponding output buffer 18. Each latch circuit 16 for the output control signal is arranged immediately before corresponding output buffer 18.

Output portion 2 is supplied with read data RD(0), RD(1), - - - , RD(15) through data line al. Data transfer latch circuits 17 receive corresponding read data RD(0), RD(1), - - - , RD(15) on its inputs, and issue data DATA(0), DATA(1), - - - , DATA(15) (which will be generally referred to as data DATA hereinafter) in response to the rising timing of output clock signal CLKO, respectively. Each latch circuit 16 for the output control signal receives control signal OEMF on its input, and generates output control signal OEM in synchronization with the rising timing of clock signal CLKO for output.

Output buffers 18 receive data DATA from corresponding data transfer latch circuits 17, and transmit output data DOUT(0), DOUT(1), - - - , DOUT(15) (which will be generally referred to as output data DOUT hereinafter) to data I/O terminals DQ in response to output control signal OEM sent from corresponding latch circuits 16 for output control signal, respectively.

Figure 9:
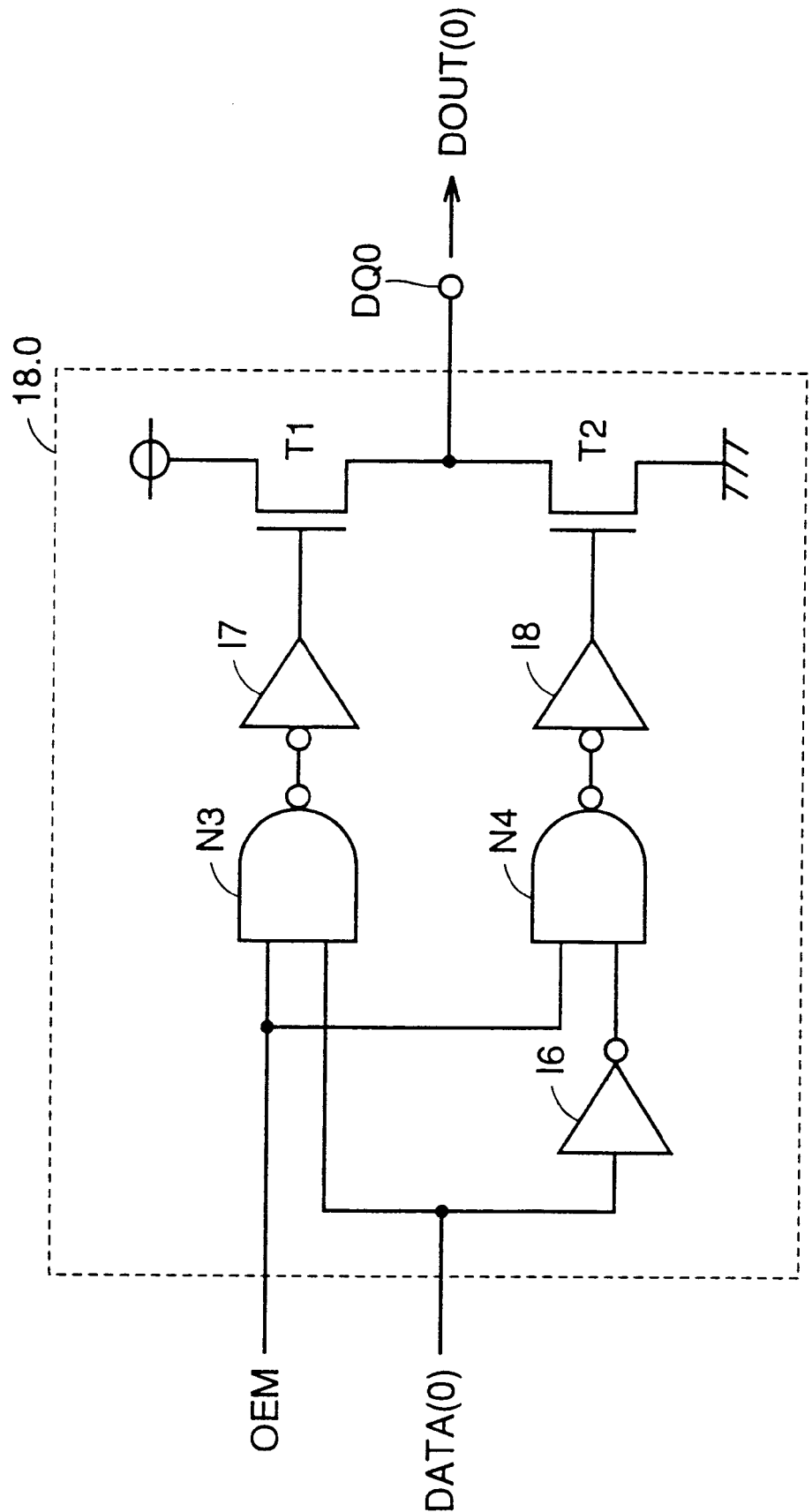
FIG. 9 is a circuit diagram showing an example of a specific structure of an output buffer 18 shown in FIG. 8.
Figure 10:
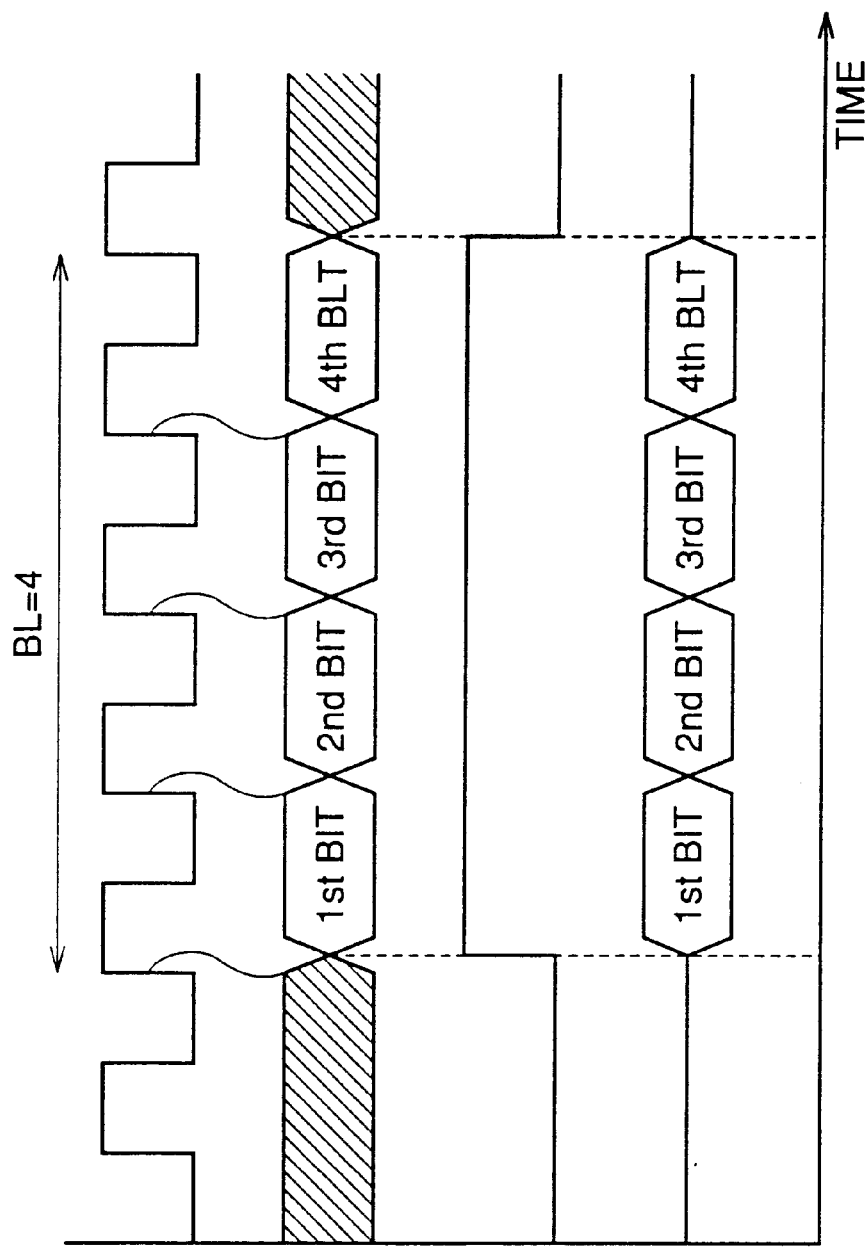
FIGS. 10A–10D are timing charts showing an operation of the synchronous semiconductor memory device 100 of the embodiment 1 of the invention.

The structure of output buffer 18 will be described below with reference to FIG. 9 showing output buffer 18.0 as a representative example. Output buffer 18.0 shown in FIG. 9 includes NAND circuits N3 and N4, inverter circuits I6, I7 and I8, and N-channel MOS transistors T1 and T2.

NAND circuit N3 receives output control signal OEM and data DATA(0) on its inputs. Inverter circuit I6 inverts data DATA(0). NAND circuit N4 receives output control signal OEM and the output of inverter circuit I6 on its inputs. Inverter circuit I7 inverts the output of NAND circuit N3. Inverter circuit I8 inverts the output of NAND circuit N4.

Transistors T1 and T2 are connected in series between the power supply voltage and the ground voltage. Transistor T1 receives on its gate electrode the output of inverter circuit I7. Transistor T2 receives on its gate electrode the output of inverter circuit I8. A connection node between transistors T1 and T2 is connected to data I/O terminal DQ0. Structures of other output buffers 18 are the same as that of output buffer 18.0 shown in FIG. 9.

An operation of synchronous semiconductor memory device 100 of the embodiment 1 of the invention will be described below with reference to timing charts of FIGS. 10A through 10D, which show the operation with burst length BL of 4.

Referring to FIGS. 8 and 10A through 10D, data DATA supplied to each output buffer 18 is generated in synchronization with output clock signal CLKO. Output control signal OEM controlling each output buffer 18 rises in synchronization with output clock signal CLKO, and holds H-level for a period equal to burst length BL.

Each output buffer 18 receives data DATA from data transfer latch circuit 17 arranged immediately before the same, and also receives output control signal OEM from output control signal latch circuit 16 arranged immediately before the same. Therefore, each output buffer 18 can output corresponding output data DOUT at every clock without an influence of delay on signal interconnections.

In particular, output buffers 18 receive corresponding data DATA through signal lines a3 (a3(0), - - - , a3(15) in FIG. 8) having lengths, which are substantially equal to lengths (a3(0)=a4(0), a3(1)=a4(1), - - - , a3(15)=a4(15) in FIG. 8) of signal interconnections a4 for receiving corresponding output control signals OEM, respectively.

This ensures that each output buffer 18 receives corresponding data DATA and output control signal OEM with the same timing. Consequently, output of invalid data can be prevented.

Further, all signal lines a3 and a4 have substantially equal lengths (a3(0)=a3(1)= - - - =a3(15)=a4(0)=a4(1)= - - - =a4(15).

Thereby, a skew on each data I/O terminal DQ can be go suppressed.

Further, all the signal interconnections extending from the position where output clock signal CLKO generates (i.e., the output node of CLKO generating circuit 10 shown in FIG. 3) to respective data transfer latch circuits 17 and respective output control signal latch circuits 16 have the substantially equal length.

Thereby, no skew is present on every data I/O terminal, and the data can be output with the further accurate timing. Consequently, the external device can accurately receive the data from synchronous semiconductor memory device 100.

Embodiment 2

A synchronous semiconductor memory device of an embodiment 2 of the invention will be described below with reference to FIG. 11.

Figure 11:
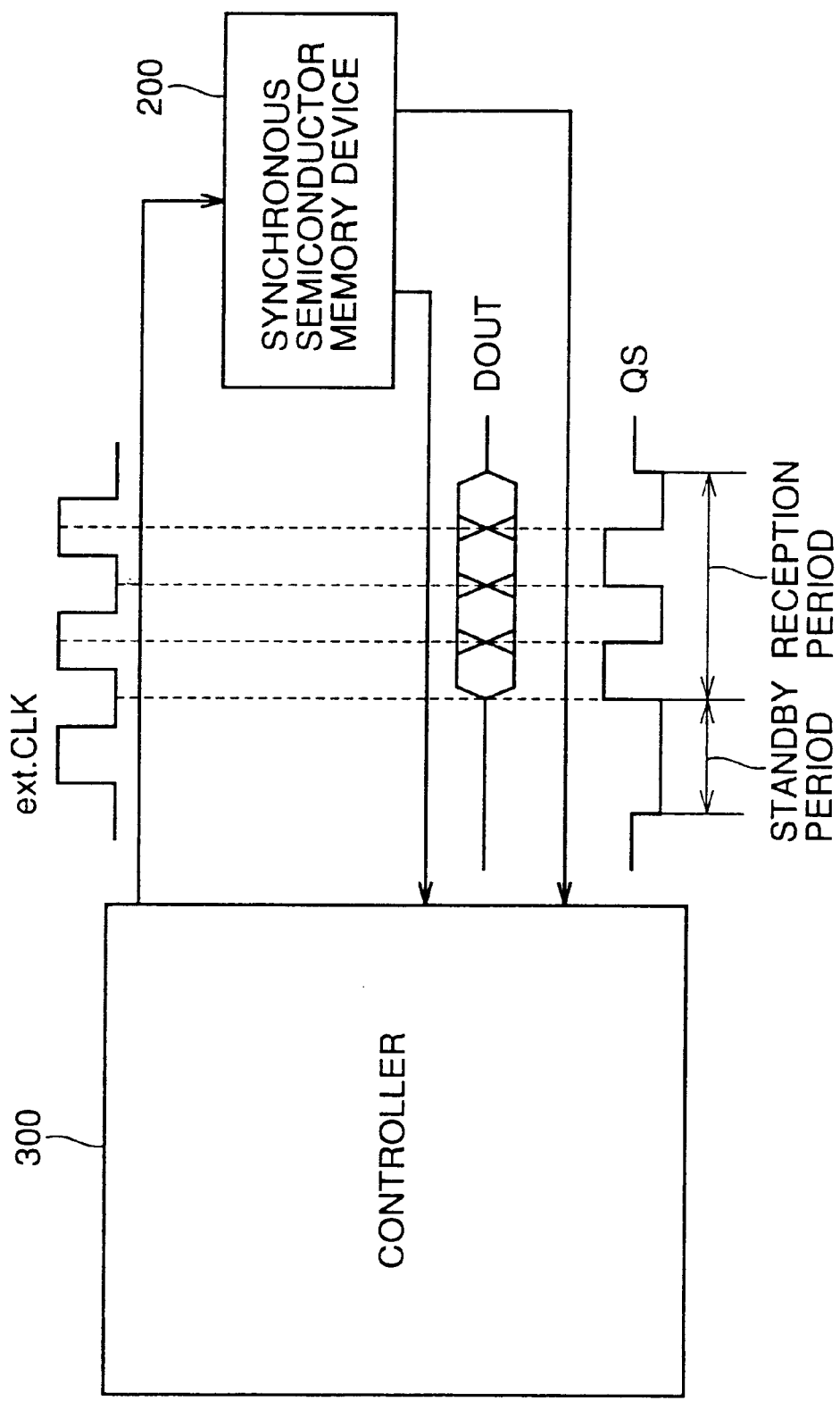
FIG. 11 shows a relationship between a synchronous semiconductor memory device 200 and an external controller 300 in an embodiment 2 of the invention.

FIG. 11 shows a relationship between a synchronous semiconductor memory device 200 and an external controller in the embodiment 2 of the invention. Synchronous semiconductor memory device 200 operates in synchronization with a system clock (external clock signal ext.CLK) sent from controller 300. Synchronous semiconductor memory device 200 is of a DDR (Double Data Rate) type which allows data transfer at double the transfer rate of conventional synchronous semiconductor memory device 900.

Synchronous semiconductor memory device 200 sends output data DOUT and data strobe signal QS instructing reception of the data to controller 300. Data strobe signal QS is at the high impedance state during a normal operation.

Data strobe signal QS is a control signal for data transfer, which is formed of a signal portion instructing standby and a synchronous signal portion instructing reception of the data.

When controller 300 receives data strobe signal QS (the signal portion instructing standby) which holds L-level for at least one clock, it starts preparation for reception of the data in response to it. When controller 300 receives the synchronous signal, it takes in data DOUT issued from synchronous semiconductor memory device 200 in response to it. Thereby, even if a difference in phase occurs between the system clock and output data DOUT, controller 300 can reliably receive output data DOUT.

An example of a whole structure of synchronous semiconductor memory device 200 shown in FIG. 11 will be described below with reference to FIG. 12. The same components as those of synchronous semiconductor memory device 100 shown in FIG. 1 bear the same reference numbers and characters, and will not be described below.

Figure 12:
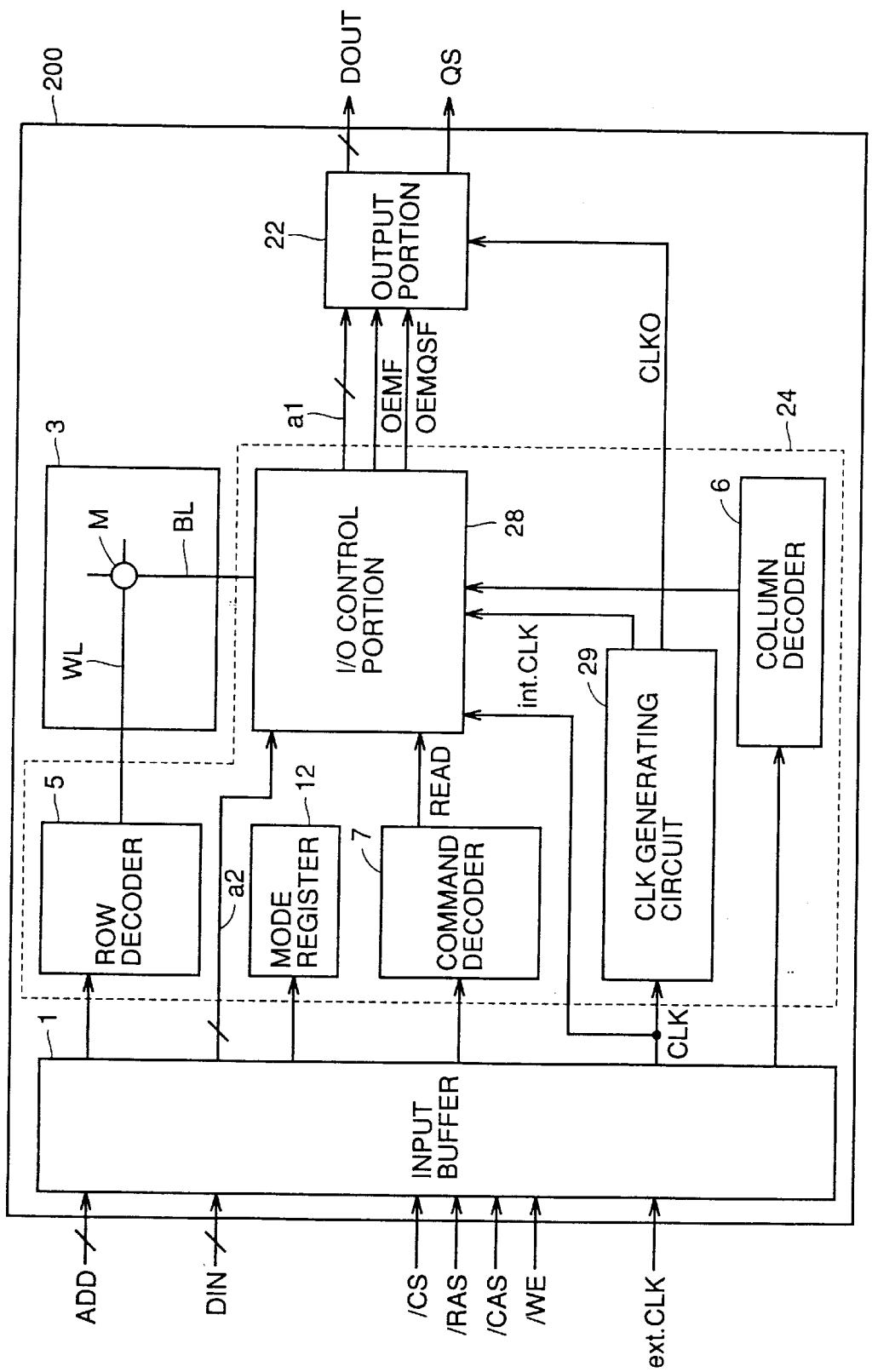
FIG. 12 is a schematic block diagram showing an example of the whole structure of the synchronous semiconductor memory device 200 shown in FIG. 11.

Synchronous semiconductor memory device 200 shown in FIG. 12 includes input buffer 1, an output portion 22, memory cell array 3 and a peripheral circuit 24.

Peripheral circuit 24 includes row decoder 5, column decoder 6, command decoder 7, mode register 12, I/O control portion 28 and a CLK generating circuit 29.

CLK generating circuit 29 will be described below with reference to a block diagram of FIG. 13 and timing charts of FIGS. 14A through 14C.

As shown in FIG. 13, CLK generating circuit 29 includes an internal CLK generating circuit 21 and a CLKO generating circuit 20. Internal CLK generating circuit 21 generates a multiplied internal clock signal int.CLK based on clock signal CLK (or external clock signal ext.CLK) as shown in FIGS. 14A and 14C. CLKO generating circuit 20 generates multiplied output clock signal CLKO based on clock signal CLK, as shown in FIGS. 14A and 14B.

The output portion 22 shown in FIG. 12 externally outputs the data at double the normal rate in response to output clock signal CLKO.

I/O control portion 28 shown in FIG. 12 will be described below with reference to FIG. 15. I/O control portion 28 shown in FIG. 15 includes OEMF generating circuit 13 and an OEMQSF generating circuit 30. OEMF generating circuit 13 outputs control signal OEMF, as already described.

An operation of OEMQSF generating circuit 30 shown in FIG. 15 will be described below with reference to timing charts of FIGS. 16A and 16B. As shown in FIGS. 16A and 16B, OEMQSF generating circuit 30 generates a control signal OEMQSF synchronized with clock signal CLK in response to read command READ. Control signal OEMQSF holds H-level for a constant period according to the burst length BL. Control signal OEMQSF determines the active period of data strobe signal QS (i.e., period during which signal QS is not at the high impedance state). Output portion 22, which will be described later, receives control signal OEMQSF, and generates data strobe signal QS.

Figure 17:
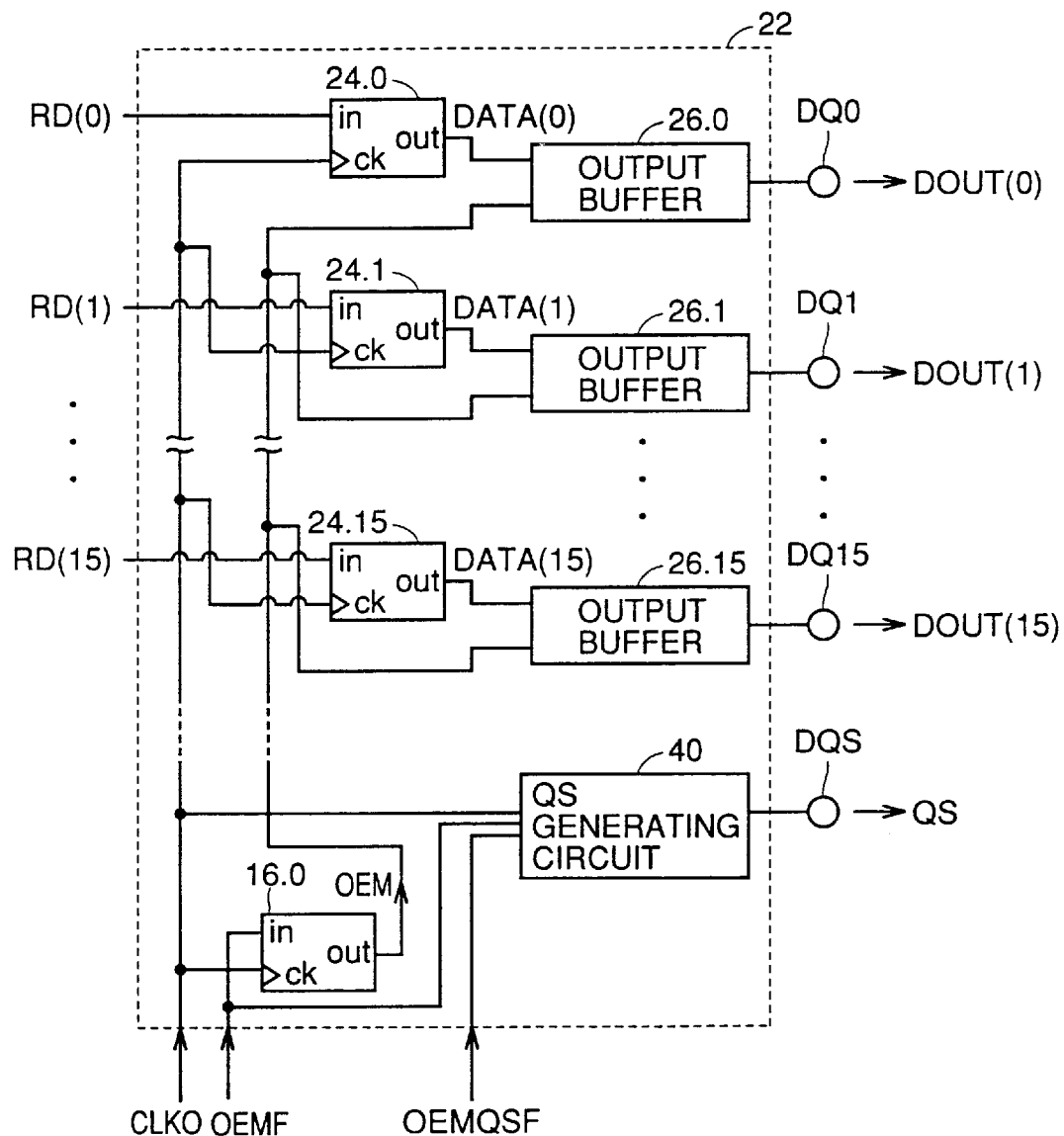
FIG. 17 is a block diagram showing an example of a specific structure of an output portion 22 shown in FIG. 12.

Then, the structure of output portion 22 shown in FIG. 12 will be described below with reference to FIG. 17. As shown in FIG. 17, output portion 22 includes a plurality of output buffers 26 corresponding to data I/O terminals DQ (FIG. 17 representatively shows output buffers 26.0, 26.1, - - -, 26.15 corresponding to data I/O terminals DQ0, DQ1, - - -, DQ15), respectively, a plurality of data transfer latch circuits 24 (FIG. 17 representatively shows data transfer latch circuits 24.0, 24.1, - - -, 24.15, respectively), a QS generating circuit 40 and output control signal latch circuit 16.0.

Figure 7:
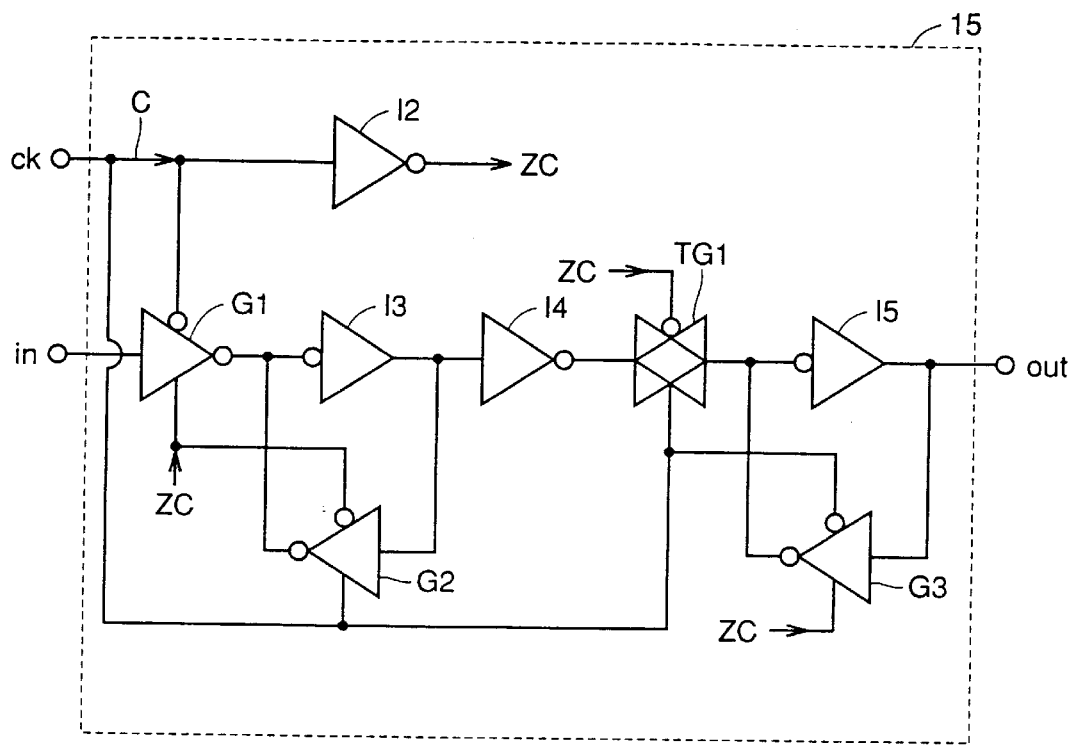
FIG. 7 is a circuit diagram showing an example of a specific structure of a latch circuit 15 of edge trigger shown in FIG. 5.

Data transfer latch circuit 24 is a latch circuit of edge trigger and, for example, has a structure similar to that of latch circuit 15 shown in FIG. 7. Data transfer latch circuits 24 receive corresponding read data RD(0), RD(1), - - -, RD(15) on their inputs, and output corresponding data DATA(0), DATA(1), - - -, DATA(15) (which will be generally referred to as data DATA hereinafter) in response to the rising timing of output clock signal CLKO, respectively.

As already described in FIG. 8, output control signal latch 16.0 receives control signal OEMF, and generates output control signal OEM in synchronization with the rising timing of output clock signal CLKO. As already described in connection with the embodiment 1, an output control signal latch circuit may be provided for each output buffer 26.

Each output buffer 26 receives corresponding data DATA from corresponding data transfer latch circuit 24, and transmits data DOUT to corresponding data I/O terminal DQ based on output control signal OEM (FIG. 17 shows data DOUT(0), DOUT(1), - - -, DOUT(15) as data DOUT). The structure of output buffer 26 is, for example, similar to that of output buffer 18.0 shown in FIG. 9.

QS generating circuit 40 shown in FIG. 17 receives output clock signal CLKO, control signal OEMF and control signal OEMQSF on its inputs, and issues data strobe signal QS to an external connection pin DQS.

The structure of QS generating circuit 40 shown in FIG. 17 will be described below with reference to FIG. 18.

Figure 18:
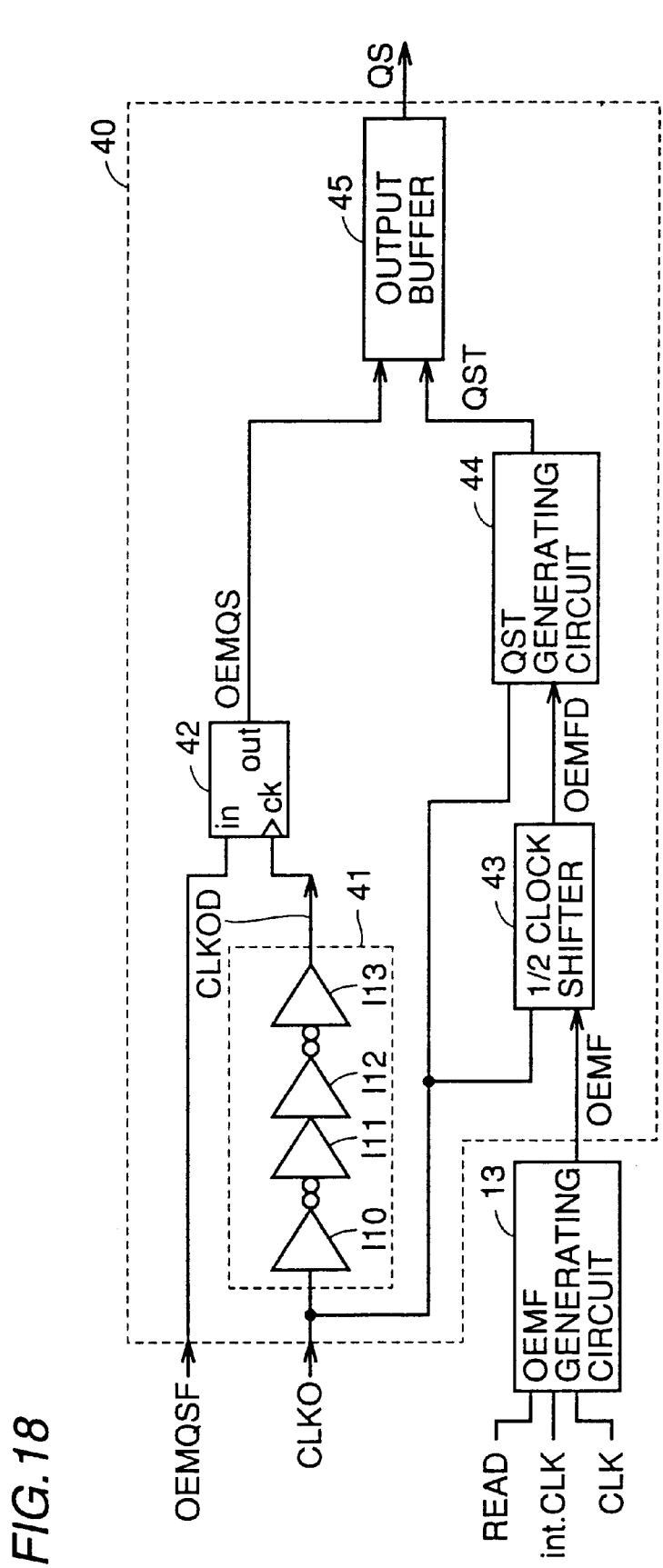
FIG. 18 is a block diagram showing an example of a specific structure of a QS generating circuit 40 shown in FIG. 17.

As shown in FIG. 18, QS generating circuit 40 includes a delay circuit 41, a latch circuit 42, a 1/2 clock shifter 43, a QST generating circuit 44 and an output buffer 45.

The structure of 1/2 clock shifter 43 shown in FIG. 18 will be described below with reference to FIG. 19.

Figure 19:
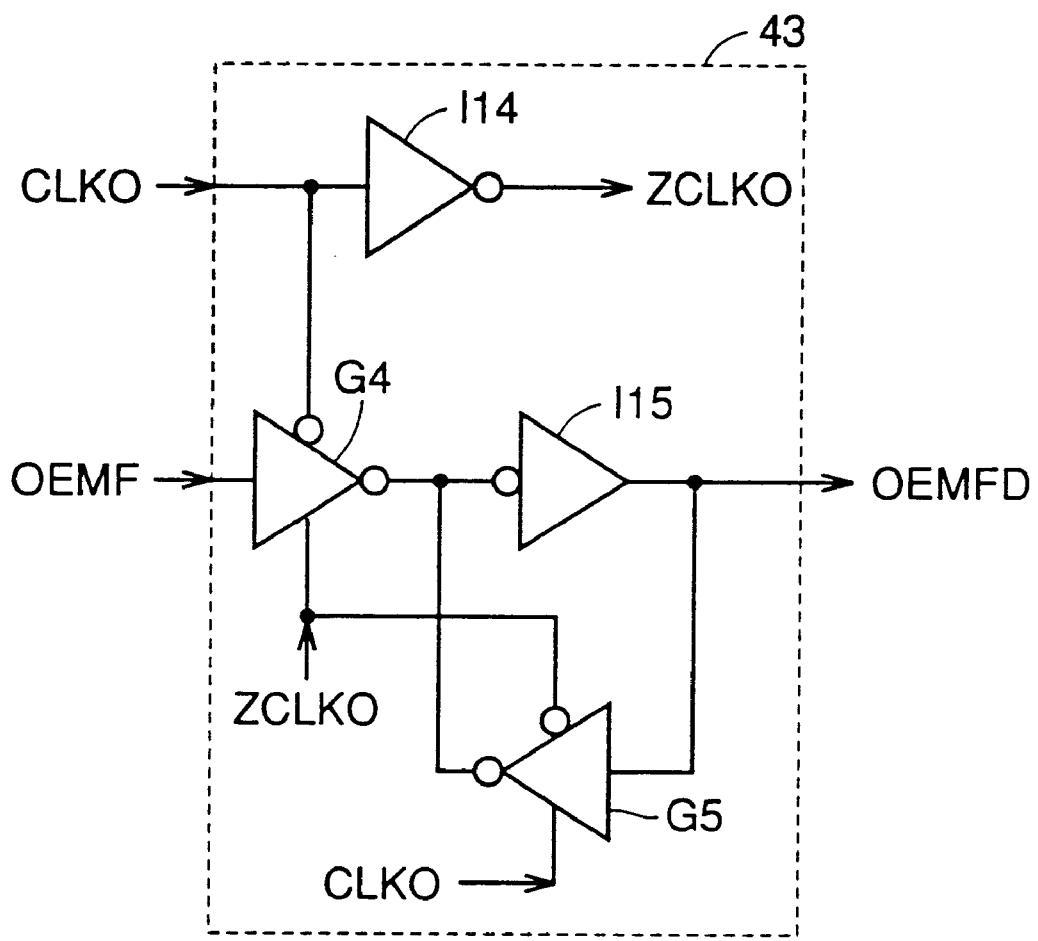
FIG. 19 is a circuit diagram showing an example of a specific structure of a 1/2 clock shifter 43 shown in FIG. 18.

1/2 clock shifter 43 shown in FIG. 19 includes inverter circuits I14 and I15 as well as gate circuits G4 and G5.

Inverter circuit I14 inverts output clock signal CLKO to output inverted signal ZCLKO. Gate circuit G4 inverts control signal OEMF and outputs the result when output clock signal CLKO is at L-level (inverted signal ZCLKO is at H-level).

The input node of inverter circuit I15 is connected to the output nodes of gate circuits G4 and G5. Gate circuit G5 inverts the output signal of inverter circuit I15 and outputs the result when output clock signal CLKO is at H-level (inverted signal ZCLKO is at L-level). Inverter circuit I15 and gate circuit G5 form a latch circuit. Control signal OEMFD is sent from the output node of inverter circuit I15.

A structure of QST generating circuit 44 shown in FIG. 18 will be described below with reference to FIG. 20.

Figure 20:
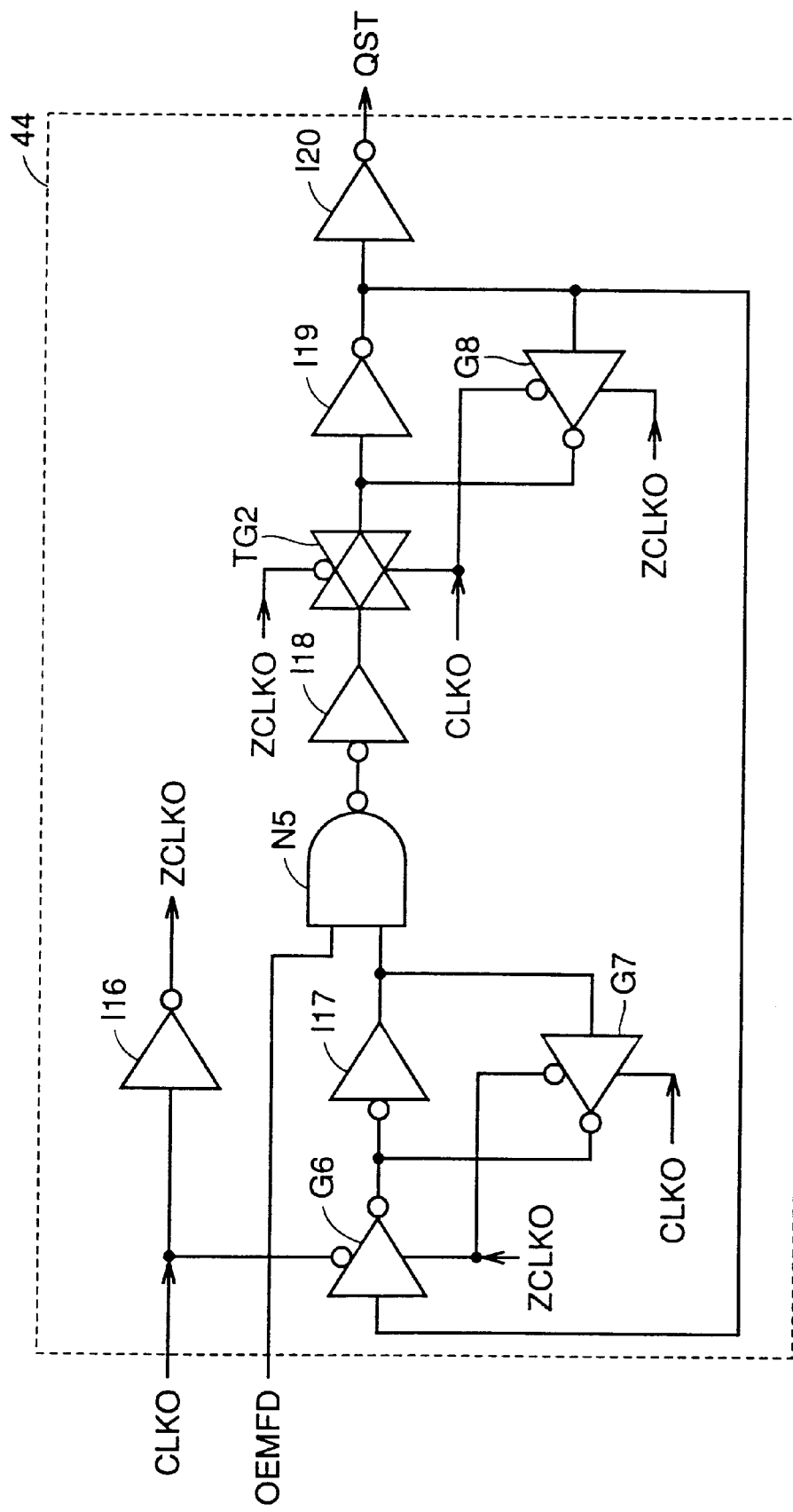
FIG. 20 is a circuit diagram showing an example of a specific structure of a QST generating circuit 44 shown in FIG. 18.

QST generating circuit 44 shown in FIG. 20 includes inverter circuits I16, I17, I18, I19 and I20, gate circuits G6, G7 and G8, a transfer gate TG2 and an NAND circuit N5.

Inverter circuit I16 inverts output clock signal CLKO inverted signal ZCLKO. Gate circuit G6 inverts and outputs an output signal of inverter circuit I19, which will be described later, when output clock signal CLKO is at L-level (inverted signal ZCLKO is at H-level).

The input node of inverter circuit I17 is connected to the output nodes of gate circuits G6 and G7. Gate circuit G7 inverts the output signal of inverter circuit I17 the result when output clock signal CLKO is at H-level (inverted signal ZCLKO is at L-level). Inverter circuit I17 and gate circuit G7 form a latch circuit. Inverter circuit I17 inverts the input signal and outputs the result.

NAND circuit N5 receives control signal OEMFD and the output signal of inverter circuit I17 on its inputs. Inverter circuit I18 inverts the output signal of NAND circuit N5 and outputs the result.

Transmission gate TG2 sends the output signal of inverter circuit I18 to inverter circuit I19 when output clock signal CLKO is at H-level (inverted signal ZCLKO is at L-level).

The input node of inverter circuit I19 is connected to the output nodes of transmission gate TG2 and gate circuit G8. Gate circuit G8 inverts the output signal of inverter circuit I19 and outputs the result when output clock signal CLKO is at L-level (inverted signal ZCLKO is at H-level). Inverter circuit I19 and gate circuit G8 form a latch circuit. Inverter circuit I20 inverts the output signal of inverter circuit I19, and outputs QST signal.

Delay circuit 41 shown in FIG. 18 includes a plurality of inverter circuit s connected in series (FIG. 18 representatively shows only inverter circuits I10, I11, I12 and I13). Delay circuit 41 receives output clock signal CLKO on its input, and delays it by a period of d0 to issue a clock signal CLKOD. Thus, delay circuit 41 adjusts the phase of output c lock signal CLKO.

Latch circuit 42 shown in FIG. 18 has a structure similar to that of latch circuit 15 shown in FIG. 7. Latch circuit 42 synchronizes control signal OEMQSF received on its input with clock signal CLKOD issued from delay circuit 41, and thereby issues a QS output control signal OEMQS, i.e., an output control signal for QS.

Output buffer 45 issues data strobe signal QS in response to QS output control signal OEMQS and QST signal received on its inputs.

An operation of QS generating circuit 40 shown in FIG. 18 will be described below with reference to timing charts of FIGS. 21A through 21J.

In FIGS. 21A through 21J, the burst length is 4 and CAS latency CSL is 1.5. In order to provide tAC (i.e., the time from the rising edge of external clock signal ext.CLK to external output of data) within ±1 ns in view of a time (about 6 ns) from input of the input signal to output of the data to the output buffer, output clock signal CLKO is issued with the timing shifted backward by 6 ns (=dt) from that of external clock signal ext.CLK, and thus with the timing delayed by ((n cycle periods of external clock signal ext.CLK)–dt, where n is an integer of 1 or more).

Figure 21:
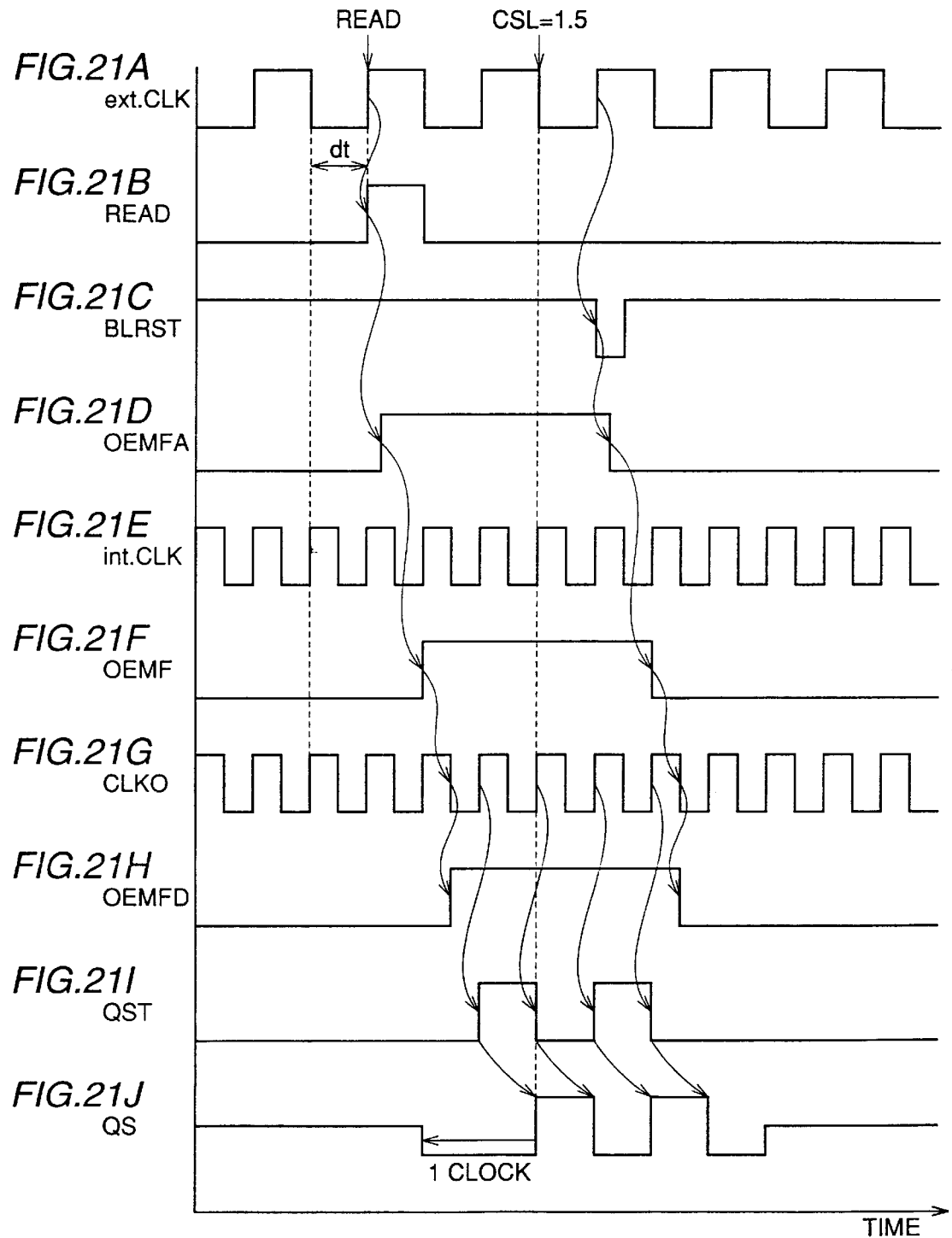
FIGS. 21A–21J are timing charts showing an operation of a QS generating circuit 40 shown in FIG. 18.

OEMF generating circuit 13 is activated in response to read command READ, as already described, so that it generates a control signal OEMFA which holds H-level for a period corresponding to burst length BL (see FIGS. 21A through 21D), and synchronizes it with internal clock signal int.CLK to generate control signal OEMF (see FIG. 21F).

1/2 clock shifter 43 latches control signal OEMF, and outputs control signal OEMFD which is received on its input, at the falling edge of output clock signal CLKO (see FIG. 21H).

OST generating circuit 44 receives control signal OEMFD issued from 1/2 clock shifter 43 on its input. QST generating circuit 44 generates QST signal at L-level while control signal OEMFD is at L-level, and changes QST signal at the rising edge of output clock signal CLKO when control signal OEMFD attains H-level (see FIGS. 21G to 21I). By providing the plurality of (but odd) inverter circuits connected together, the QST signal is formed of pulse trains.

QST signal forms the synchronous signal portion of data strobe signal QS.

Output buffer 45 generates data strobe signal QS in response to QS output control signals OEMQS and QST signals received on its inputs (see FIG. 21J).

An example of an operation of synchronous semiconductor memory device 200 of the embodiment 2 of the invention will be described below with reference to timing charts of FIGS. 22A through 22I.

External clock signal ext.CLK (clock signal CLK) is 83 MHz (=12 ns). External clock signal ext.CLK or clock signal CLK has a cycle of T.

Burst length is 4, and CAS latency CSL is 1.5. Output clock signal CLKO is shifted backward from external clock signal ext.CLK by 6 ns (=dt), and thus is delayed therefrom by (T−dt) ns. In this case, the rising timing of clock signal CLK is coincident with the rising timing of output clock signal CLKO (see FIGS. 22A and 22B).

Figure 22:
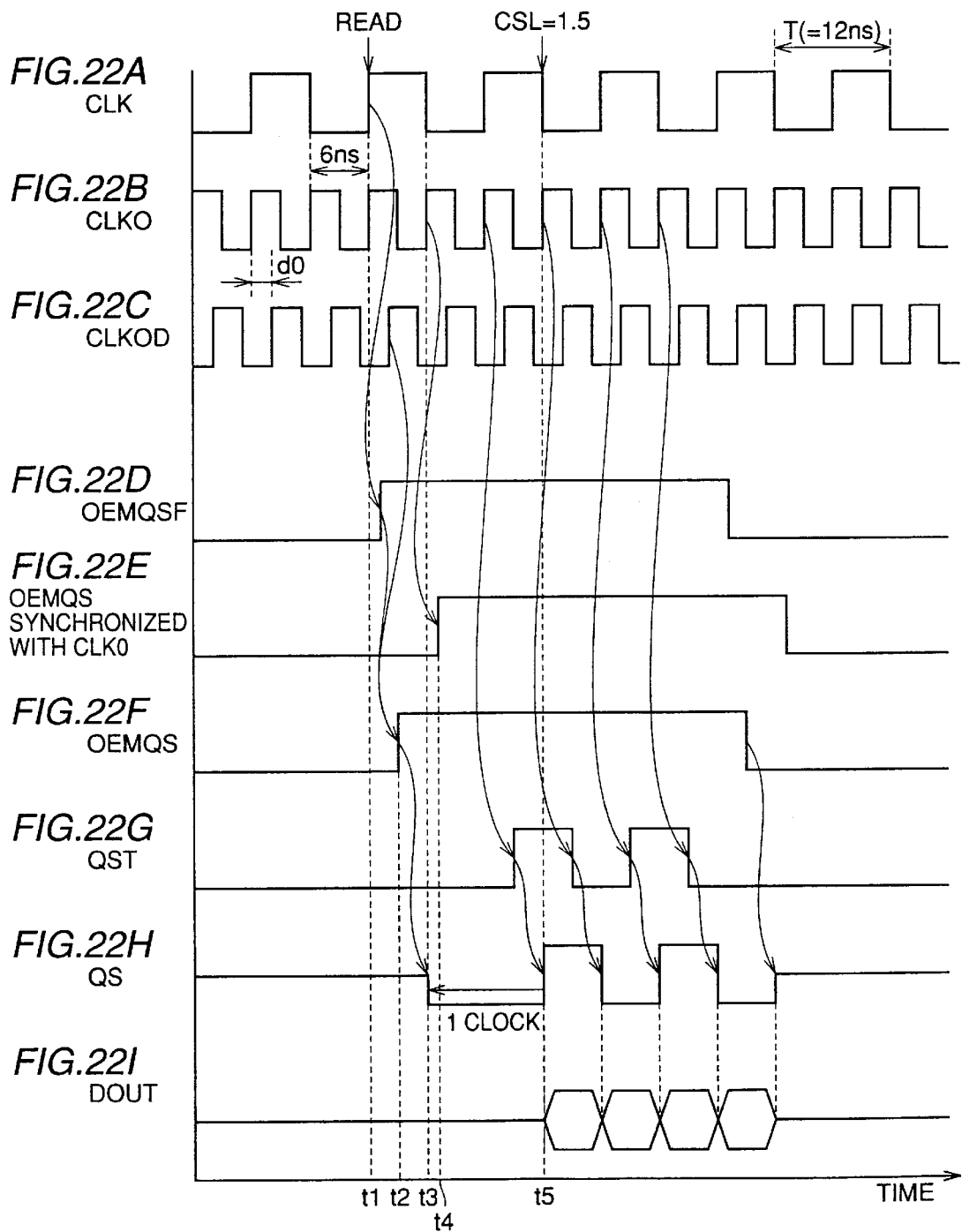
FIGS. 22A–22I are examples of timing charts showing an operation of the synchronous semiconductor memory device 200 of the embodiment 2 of the invention.

When read command READ is generated at time t1, control signal OEMQSF attains the active state of H-level in response to this (see FIG. 22D).

Since CAS latency CSL is 1.5, the synchronous signal is issued at time t5 after 1.5 clocks, based on clock signal CLK (external clock signal ext.CLK), from the time (time t1) of application of read command READ.

For example, if QS output control signal OEMQS is generated by synchronizing control signal OEMQSF with output clock signal CLKO (see FIG. 22E), QS output control signal OEMQS is activated at the time (time t4) delayed by at least 1 clock from output clock signal CLKO. Therefore, data strobe signal QS is set to L-level at time t4 (>t1+0.5T). Therefore, data strobe signal QS cannot ensure the state at L-level (specifying the standby) for one clock.

Meanwhile, synchronous semiconductor memory device 200 uses clock signal CLKOD delayed from output clock signal CLKO by a period of d0. When QS output control signal OEMQS is generated by synchronizing control signal OEMQSF with clock signal CLKOD (see FIG. 22C) as shown in FIG. 22F, QS output control signal OEMQS attains the active state of H-level at time t2 delayed from output clock signal CLKO by 0.5 clock.

When clock signal CLKOD is used, therefore, data strobe signal QS is set to L-level at time t3 (<t1+0.5T). Thereby, data strobe signal QS can hold the state of L-level for at least one clock (=t5−t3) after it attained L-level with a predetermined timing. Further, the synchronous signal portion is synchronized with the output timing of output data DOUT.

FIGS. 23A through 23I show other examples of the timing charts for showing the operation of the output portion 22 in the embodiment 2 of the invention, and more specifically show the operation with external clock signal ext.CLK (clock signal CLK) of 50 MHz (=20 ns). The burst length is 4, and CAS latency is 1.5. Output clock signal CLKO is shifted backward by 6 ns (=dt) from external clock signal ext.CLK, and therefore is delayed by (T−dt) therefrom.

Figure 23:
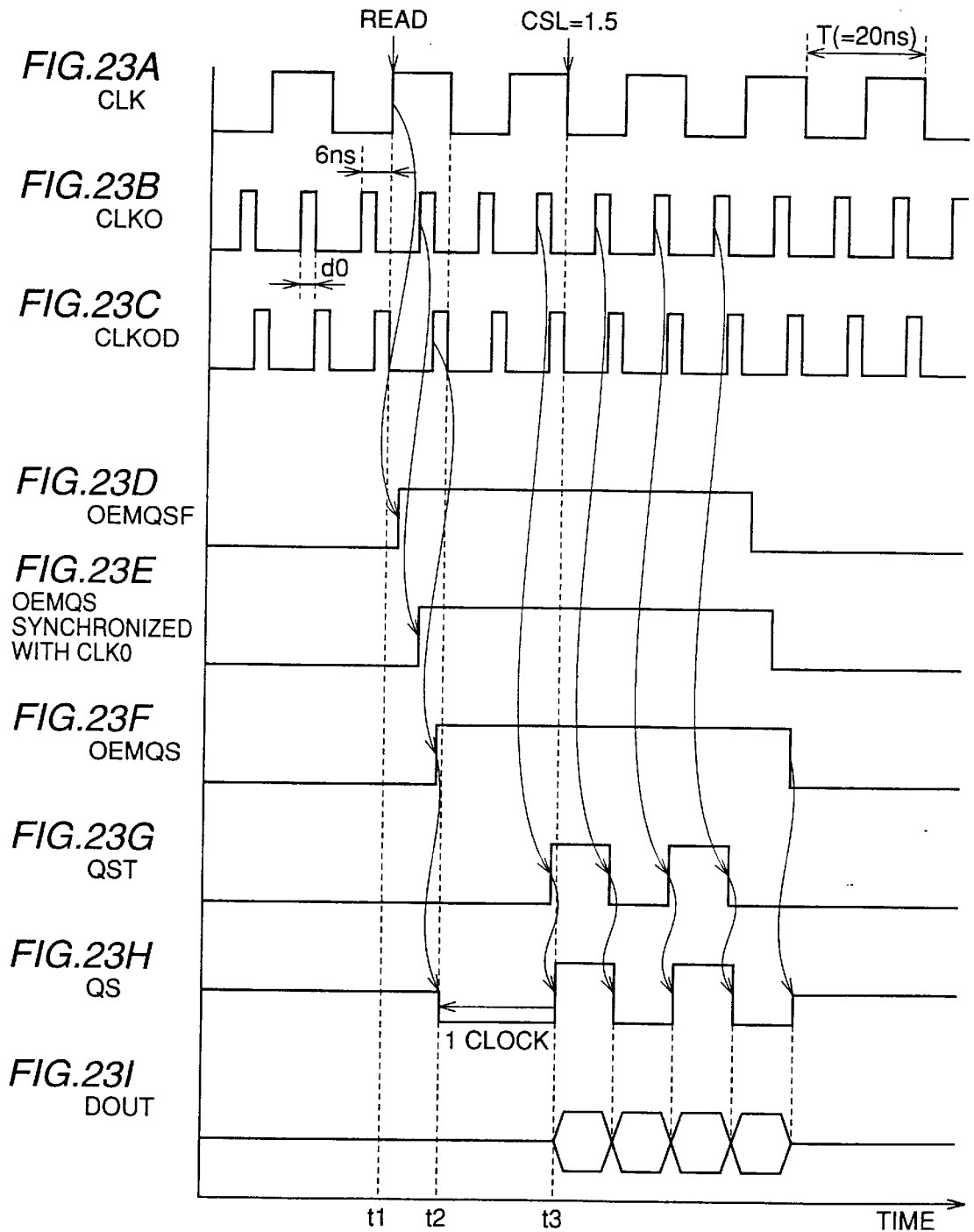
FIGS. 23A–23I are other examples of timing charts showing an operation of the synchronous semiconductor memory device 200 of the embodiment 2 of the invention.
Figure 26:
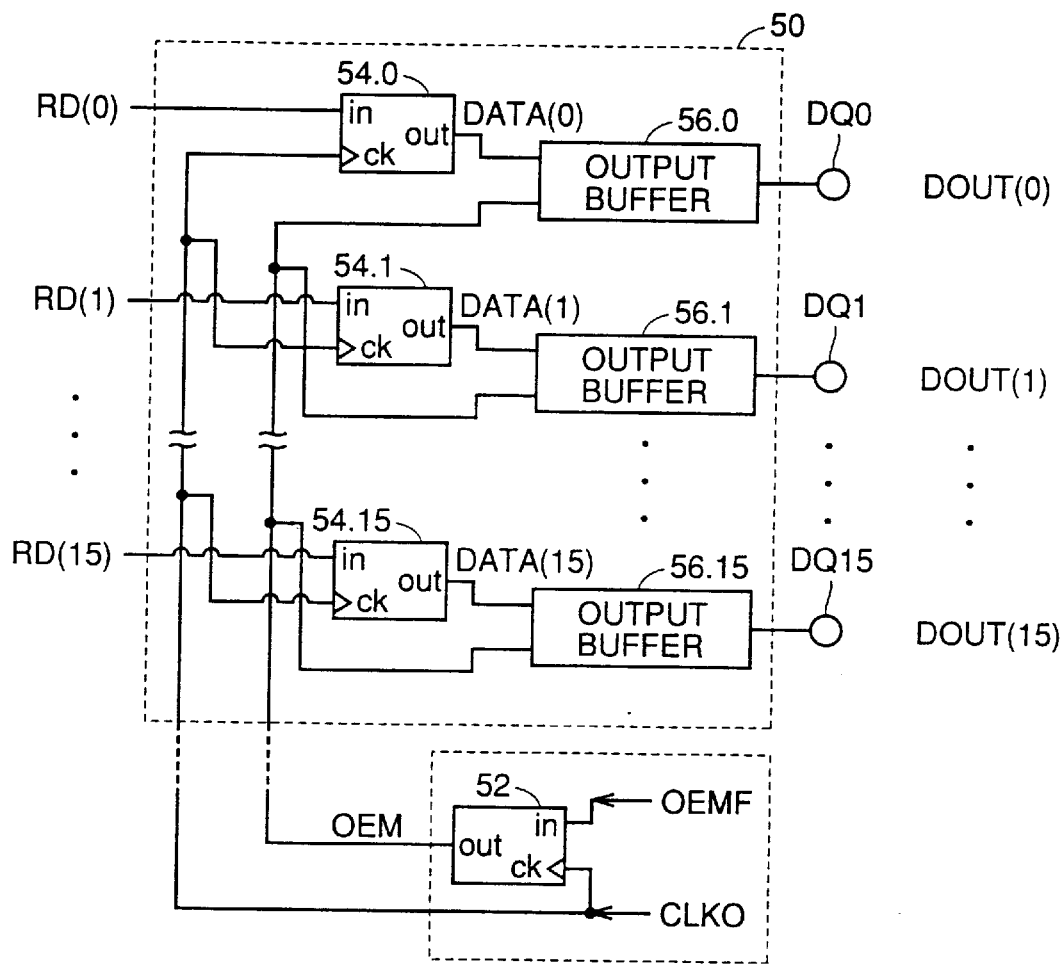
FIG. 26 shows an example of a structure of a major portion of an output portion 50 in the prior art.

When read command READ is issued at time t1, control signal OEMQSF attains the active state at H-level in response to it (see FIG. 23D).

Since CAS latency CSL is 1.5, the synchronous signal is issued at time t3, i.e., after 1.5 clocks based on external clock signal ext.CLK from application (t1) of read command READ.

By using clock signal CLKOD (see FIG. 23C), control signal OEMQSF is synchronized with clock signal CLKOD (see FIG. 23E). Thereby, data strobe signal QS can attain L-level with a predetermined timing when QS output control signal OEMQS is generated, and thereafter can hold the state at L-level for a period of at least one clock. Further, the synchronous signal portion is synchronized with the output timing of output data DOUT.

In this case, even if QS output control signal OEMQS is issued by synchronizing control signal OEMQSF with output clock signal CLKO (see FIG. 23E), data strobe signal QS can keep the state at L-level for at least one clock.

As described above, the phase of output clock signal CLKO is adjusted so that the activation start timing (i.e., timing of instruction of standby) of data strobe signal QS can keep a constant relationship with respect to external clock signal ext.CLK independently of the frequency of external clock signal ext.CLK.

Thereby, external controller 300 shown in FIG. 11 can receive data strobe signal QS at L-level to prepare for data reception when predetermined clock cycles elapse after generation of read command READ. Further, controller 300 can accurately receive output data DOUT of synchronous semiconductor memory device 200 in response to the synchronous signal portion of data strobe signal QS with an intended timing.

In not only synchronous semiconductor memory device 200 of the DDR type but also a normal synchronous semiconductor memory device, a shift may occur between external clock signal ext.CLK and output clock signal CLKO if an operation speed is high. In this case, therefore, the phase of output clock signal CLKO can be adjusted to generate desired data strobe signal QS, whereby data transfer to the controller can be performed correctly.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device comprising:

means for taking in an external signal applied in synchronization with an external clock signal formed of a pulse train;

internal clock signal generating means for generating an internal clock signal synchronized with said external clock signal;

a plurality of memory cells;

a plurality of data output terminals;

read means for reading data from said plurality of memory cells in response to a read command based on said external signal;

a plurality of output means provided correspondingly to said plurality of data output terminals for transmitting output data corresponding to said read data to said corresponding data output terminals, respectively;

a plurality of data transfer means provided correspondingly to said plurality of output means each for transferring the data read by said read means to said output means in response to said internal clock signal, respectively;

control means for generating a control signal in response to said read command; and a plurality of output control signal generating means provided correspondingly to said plurality of output means each for generating an output control signal enabling the transmitting operation of said corresponding output means in response to said control signal and said internal clock signal, and outputting said generated output control signal to said corresponding output means.

2. The synchronous semiconductor memory device according to claim 1, wherein a signal interconnection of each of said plurality of output means for receiving the output of the corresponding data transfer means has a length substantially equal to that of a signal interconnection of the same output means for receiving the output of the corresponding output control signal generating means.

3. The synchronous semiconductor memory device according to claim 1, wherein all signal interconnections for supplying the outputs of said plurality of data transfer means to the corresponding output means, respectively, have lengths substantially equal to those of signal interconnections for supplying the outputs of said plurality of output control signal generating means to the corresponding output means, respectively.

4. The synchronous semiconductor memory device according to claim 2, wherein signal interconnections for supplying said internal clock signal from said internal clock signal generating means to said plurality of output control signal generating means, respectively, have lengths substantially equal to those of signal interconnections for supplying said internal clock signal from said internal clock signal generating means to said plurality of data transfer means, respectively.

5. The synchronous semiconductor memory device according to claim 3, wherein signal interconnections for supplying said internal clock signal from said internal clock signal generating means to said plurality of output control signal generating means, respectively, have lengths substantially equal to those of signal interconnections for supplying said internal clock signal from said internal clock signal generating means to said plurality of data transfer means, respectively.

6. A synchronous semiconductor memory device for outputting output data to an external controller in response to a read command comprising:

means for taking in an external signal applied in synchronization with an external clock signal formed of a pulse train;

internal clock signal generating means for generating an internal clock signal synchronized with said external clock signal;

a plurality of memory cells;

read means for reading data from said plurality of memory cells in response to a read command based on said external signal;

transfer control means for issuing, in response to said read command, to said controller a data transfer control signal including a synchronous signal portion synchronized with said internal clock signal for instructing said controller to receive said output data and a standby signal portion located at a leading position of said synchronous signal and holding an active state at a constant level for a period of at least one clock for instructing said controller to stand by; and output means for outputting to said controller said output data corresponding to said read data in synchronization with said internal clock signal.

7. The synchronous semiconductor memory device according to claim 6, further comprising:

first control signal generating means for generating a first control signal in response to said read command;

output control signal generating means for generating an output control signal enabling the output operation of said output means in response to said first control signal and said internal clock signal, and outputting the generated output control signal same to said output means;

second control signal generating means for generating, in response to said read command, a second control signal determining a start timing of activation of said standby signal, wherein said transfer control means includes:
synchronous signal generating means for generating said synchronous signal in response to said internal clock signal and said first control signal,
adjusting means for outputting a clock signal by adjusting a phase of said internal clock signal, and
standby signal generating means for adjusting the start timing of activation of said standby signal by synchronizing said second control signal with the clock signal output from said adjusting means.

8. The synchronous semiconductor memory device according to claim 7, wherein said internal clock signal includes a first internal clock signal of a frequency obtained by multiplying a frequency of said external clock signal, said output means outputs said output data in synchronization with said first internal clock signal, said synchronous signal is synchronized with said first internal clock signal, and said adjusting means adjusts a phase of said first internal clock signal.

* * * * *